US012709821B2

(12) United States Patent
D'Evelyn et al.

(10) Patent No.: US 12,709,821 B2
(45) Date of Patent: Aug. 18, 2026

(54) HEATER FOR RETROGRADE SOLVOTHERMAL CRYSTAL GROWTH, METHOD OF MAKING, AND METHOD OF USE

(71) Applicants: SLT Technologies, Inc., Los Angeles, CA (US); Kyocera Corporation, Kyoto (JP)

(72) Inventors: Mark P. D'Evelyn, Vancouver, WA (US); Paul M. Von Dollen, Brush Prairie, WA (US); Rajeev Tirumala Pakalapati, Vancouver, WA (US); Keiji Fukutomi, Vancouver, WA (US); Maimi Monzen, Ikoma (JP); Koji Miyamoto, Ikoma-gun (JP); Motoi Tamaki, Suita (JP)

(73) Assignees: SLT Technologies, Inc., San Diego, CA (US); Kyocera Corporation, Kyoto (JP)

( * ) Notice: Subject to any disclaimer, the term of this patent is extended or adjusted under 35 U.S.C. 154(b) by 806 days.

(21) Appl. No.: 17/963,004

(22) Filed: Oct. 10, 2022

(65) Prior Publication Data

US 2023/0110306 A1 Apr. 13, 2023

Related U.S. Application Data

(60) Provisional application No. 63/254,411, filed on Oct. 11, 2021.

(51) Int. Cl.
*C30B 35/00* (2006.01)
*C30B 7/10* (2006.01)

(52) U.S. Cl.
CPC ........... *C30B 35/007* (2013.01); *C30B 7/105* (2013.01)

(58) Field of Classification Search
CPC ...... C30B 29/406; C30B 35/007; C30B 7/105
See application file for complete search history.

(56) References Cited

U.S. PATENT DOCUMENTS 3,101,259 A 8/1963 Sawyer
4,300,979 A 11/1981 Kolb et al.
(Continued)

FOREIGN PATENT DOCUMENTS

AT 395985 B 4/1993
CN 111593398 A 8/2020
(Continued)

OTHER PUBLICATIONS

Ehrentraut et al., Ammonothermal Crystal Growth of Gallium Nitride—A brief discussion of critical issues, Journal of Crystal Growth, Elsevier, Amsterdam, Sep. 1, 2010, 5 pages.
(Continued)

*Primary Examiner* — Hua Qi
(74) *Attorney, Agent, or Firm* — Procopio, Cory, Hargreaves & Savitch LLP

(57) ABSTRACT

An apparatus for solvothermal crystal growth includes a vertically oriented cylindrical pressure vessel defining a growth chamber, and a cylindrical heater having independently controllable upper and lower heating zones. At least one end heater is positioned adjacent to an end of the growth chamber. A baffle may be disposed within the chamber such that an inward-facing surface of the baffle is within 100 mm of a top or bottom end surface of the chamber. The end heater is configured to control temperature uniformity during crystal growth such that temperature variation along a radial distance of a cylindrical surface within the pressure vessel is less than about 10° C., and temperature variation along an inner diameter surface of the growth chamber is
(Continued)

less than about 20° C. within an axial distance of at least 100 mm from the proximate chamber end.

18 Claims, 15 Drawing Sheets

(56) References Cited

U.S. PATENT DOCUMENTS

| | | | | |
|---|---|---|---|---|
| 6,656,615 | B2 | 12/2003 | Dwilinski et al. | |
| 7,078,731 | B2 | 7/2006 | D'Evelyn et al. | |
| 7,642,122 | B2 | 1/2010 | Tysoe et al. | |
| 7,705,276 | B2 | 4/2010 | Giddings et al. | |
| 9,299,555 | B1 | 3/2016 | Alexander et al. | |
| 9,724,666 | B1 | 8/2017 | Rajeev et al. | |
| 10,036,099 | B2 | 7/2018 | D'Evelyn et al. | |
| 10,174,438 | B2 | 1/2019 | Pakalapati et al. | |
| 2005/0152820 | A1 | 7/2005 | D'Evelyn et al. | |
| 2008/0083741 | A1 * | 4/2008 | Giddings ................. | H05B 3/48<br>219/534 |
| 2009/0320744 | A1 | 12/2009 | D'Evelyn | |
| 2010/0031876 | A1 | 2/2010 | D'Evelyn | |
| 2011/0183498 | A1 | 7/2011 | D'Evelyn | |
| 2014/0205840 | A1 | 7/2014 | Aoki et al. | |
| 2016/0376726 | A1 | 12/2016 | Hashimoto | |
| 2022/0136128 | A1 | 5/2022 | D'Evelyn et al. | |
| 2024/0026563 | A1 | 1/2024 | D'Evelyn et al. | |
| 2024/0158948 | A1 | 5/2024 | Von Dollen et al. | |
| 2024/0158949 | A1 | 5/2024 | Von Dollen | |
| 2024/0158950 | A1 | 5/2024 | Von Dollen et al. | |
| 2024/0158951 | A1 | 5/2024 | Von Dollen et al. | |
| 2024/0159348 | A1 | 5/2024 | Von Dollen | |

FOREIGN PATENT DOCUMENTS

| | | | |
|---|---|---|---|
| CN | 216768741 | U | 6/2022 |
| EP | 2505696 | A1 | 10/2012 |
| JP | 2013067556 | A | 4/2013 |
| JP | 2013095643 | A | 5/2013 |
| WO | 2005/114256 | A1 | 12/2005 |
| WO | 2017205882 | A1 | 12/2017 |

OTHER PUBLICATIONS

PCT/US2022/077867, International Search Report and Written Opinion dated Jan. 20, 2023, 14 pages.
PCT/US2023/070635, International Search Report and Written Opinion dated Nov. 7, 2023, 11 pages.
PCT/US2023/079423, International Search Report and Written Opinion dated Feb. 27, 2024, 11 pages.
PCT/US2023/078816, International Search Report and Written Opinion dated Feb. 9, 2024, 15 pages.
PCT/US2023/079391, International Search Report and Written Opinion dated Feb. 8, 2024, 10 pages.
PCT/US2023/079417, International Search Report and Written Opinion dated Feb. 27, 2024, 15 pages.
Anonymous: "Stainless Steel Perforated Metal", Anping Shengjia Hardware & Mesh Co., Ltd., Apr. 16, 2021 (Apr. 16, 2021), pp. 1-4, XP093128625 <https://web.archive.org/web/20210416114542/https://www.sjhardwaremesh.com/en/products/stainless-steel/stainless-steel-perforated-metal.html> , 5 pages.
Peters, "Ammonothermal Synthesis of Aluminium Nitride", Journal of Crystal Growth 104, 411-418 (1990).
Dwilinski et al., "Excellent crystallinity of truly bulk ammonothermal GaN", Journal of Crystal Growth 310, 3911-3916 (2008).
Tomida et al., "Effect of halogen species of acidic mineralizer on solubility of GaN in supercritical ammonia", Journal of Crystal Growth 325, 52-54 (2011).

* cited by examiner

HEATER FOR RETROGRADE SOLVOTHERMAL CRYSTAL GROWTH, METHOD OF MAKING, AND METHOD OF USE

CROSS REFERENCE TO RELATED APPLICATIONS

This application claims benefit of U.S. provisional patent application Ser. No. 63/254,411, filed Oct. 11, 2021, which is herein incorporated by reference.

BACKGROUND

Field

The present disclosure generally relates to processing of materials in supercritical fluids for growth of crystals useful for forming bulk substrates that can be used to form a variety of optoelectronic, integrated circuit, power device, laser, light emitting diode, photovoltaic, and other related devices.

Description of Related Art

The present disclosure relates generally to techniques for processing materials in supercritical fluids, such as growth of single crystals. Examples of such crystals include metal oxides, such as $MXO_4$ crystals, where M represents Al or Ga and X represents P or As, and metal nitrides, such as GaN, AlN, InN, InGaN, AlGaN, and AlInGaN. More specifically, embodiments of the disclosure include techniques for controlling parameters associated with material processing within a capsule or liner disposed within a high-pressure apparatus enclosure. Gallium nitride containing crystalline materials are useful as substrates for manufacture of optoelectronic and electronic devices, such as lasers, light emitting diodes, solar cells, photoelectrochemical water splitting and hydrogen generation devices, photodetectors, integrated circuits, and transistors, among other devices.

Supercritical fluids are used to process a wide variety of materials. A supercritical fluid is often defined as a substance beyond its critical point, i.e., critical temperature and critical pressure. A critical point represents the highest temperature and pressure at which the substance can exist as a vapor and liquid in equilibrium. In certain supercritical fluid applications, the materials being processed are placed inside a pressure vessel or other high-pressure apparatus. In some cases, it is desirable to first place the materials inside a container, liner, or capsule, which in turn is placed inside the high-pressure apparatus. In operation, the high-pressure apparatus provides structural support for the high pressures generated within the container or capsule holding the materials. The container, liner, or capsule provides a closed/sealed environment that is chemically inert and impermeable to solvents, solutes, and gases that may be involved in or generated by the process.

Supercritical fluids provide an especially ideal environment for growth of high-quality crystals, that is, a solvothermal process, in large volumes and low costs. In many cases, supercritical fluids possess the solvating capabilities of a liquid with the transport characteristics of a gas. Thus, on the one hand, supercritical fluids can dissolve significant quantities of a solute for recrystallization. On the other hand, the favorable transport characteristics include a high diffusion coefficient, so that solutes may be transported rapidly through the boundary layer between the bulk of the supercritical fluid and a growing crystal, and also a low viscosity, so that the boundary layer is very thin and small temperature gradients can cause facile self-convection and self-stirring of the reactor. This combination of characteristics enables, for example, the growth of hundreds or thousands of large α-quartz crystals in a single growth run in supercritical water.

In some applications, such as crystal growth, the pressure vessel or capsule also includes a baffle plate that separates the interior into different chambers, e.g., a top half and a bottom half. The baffle plate typically has a plurality of random or regularly spaced holes to enable fluid flow and heat and mass transfer between these different chambers, which hold the different materials being processed along with a supercritical fluid. For example, in typical crystal growth applications, one end of the capsule contains seed crystals and the other end contains nutrient material. In addition to the materials being processed, the capsule contains a solid or liquid that forms the supercritical fluid at elevated temperatures and pressures and, typically, also a mineralizer to increase the solubility of the materials being processed in the supercritical fluid. In some cases, the mineralizer is a mixture of two or more substances [e.g., S. Tysoe, et al., U.S. Pat. No. 7,642,122 (2010)]. In operation, the capsule is heated and pressurized toward or beyond the critical point, thereby causing the solid and/or liquid to transform into the supercritical fluid. In some applications the fluid may remain subcritical, that is, the pressure or temperature may be less than the critical point. However, in all cases of interest here, the fluid is superheated, that is, the temperature is higher than the boiling point of the fluid at atmospheric pressure. The term "supercritical" will be used throughout to mean "superheated", regardless of whether the pressure and temperature are greater than the critical point, which may not be known for a particular fluid composition with dissolved solutes.

In a number of solvothermal crystal growth systems the solubility is "normal", that is, the solubility of the substance to be crystallized increases with increasing temperature of the supercritical fluid. In such cases a nutrient material is placed in the hotter end of the growth chamber and seed crystals in the cooler end, with the cooler end above the hotter end so that free convection mixes the fluid. Examples of these systems include α-quartz in supercritical water with NaOH as mineralizer and GaN in supercritical ammonia with acidic mineralizers $NH_4Cl$, $NH_4Br$, or $NH_4I$ [D. Tom ida, et al., J. Crystal Growth 325, 52 (2011)]. In other cases the solubility is "retrograde", that is, the solubility decreases with increasing temperature and the relative positions of the nutrient material and seeds within the growth chamber are reversed. Examples of systems with retrograde solubility include $AlPO_4$ (berlinite) in supercritical water with HCl as mineralizer [E. D. Kolb and R. A. Laudise, U.S. Pat. No. 4,300,979 (1981)] and AlN in supercritical ammonia with basic mineralizer $KNH_2$ [D. Peters, J. Crystal Growth 104, 411 (1990)]. GaN in supercritical ammonia with basic mineralizer $KNH_2$ similarly exhibits retrograde solubility [R. Dwilinski, et al., J. Crystal Growth 310, 3911 (2008)]. GaN in supercritical ammonia with acidic mineralizer $NH_4F$ also exhibits retrograde solubility [M. D'Evelyn, et al., U.S. Pat. No. 7,078,731 (2006)], in contrast to the other acidic mineralizers mentioned above.

A challenge associated with crystal growth in a retrograde solubility system is that the hottest points in the growth chamber are typically on the wall surrounding the seed crystals, with the consequence that adventitious nuclei may form on the walls and grow preferentially with respect to the seed crystals. Wall crystallization may decrease the material efficiency of the process, that is, the fraction of dissolved nutrient material that crystallizes on the seed crystals, and may also interfere with the growth of crystals proximate to the walls. The severity of this wall deposition problem may be sensitive to the temperature distribution on the walls surrounding the seed crystals, which in turn may be strongly influenced or determined by the details of the heater(s) used to heat the pressure vessel or capsule.

In certain other applications, it may be desirable to maintain an environment within a pressure vessel that is very isothermal, which may not be possible with existing pressure vessels and associated heaters.

Therefore, what is needed is an improved heater that enables reduced wall deposition for solvothermal crystal growth where the solubility is retrograde by optimizing the temperature distribution on surfaces in the growth zone.

SUMMARY

According to the present disclosure, techniques related to processing of materials for growth of crystals are provided. More particularly, the present disclosure provides an improved heater suitable for use in conjunction with a high-pressure vessel for crystal growth of a material having a retrograde solubility in a supercritical fluid, including crystal growth of a group III metal nitride crystal by an ammonobasic or ammonoacidic technique, but there can be others. In other embodiments, the present disclosure provides methods suitable for synthesis of crystalline nitride materials, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

The present disclosure achieves these benefits and others in the context of known process technology. However, a further understanding of the nature and advantages of the present disclosure may be realized by reference to the latter portions of the specification and attached drawings.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1B:
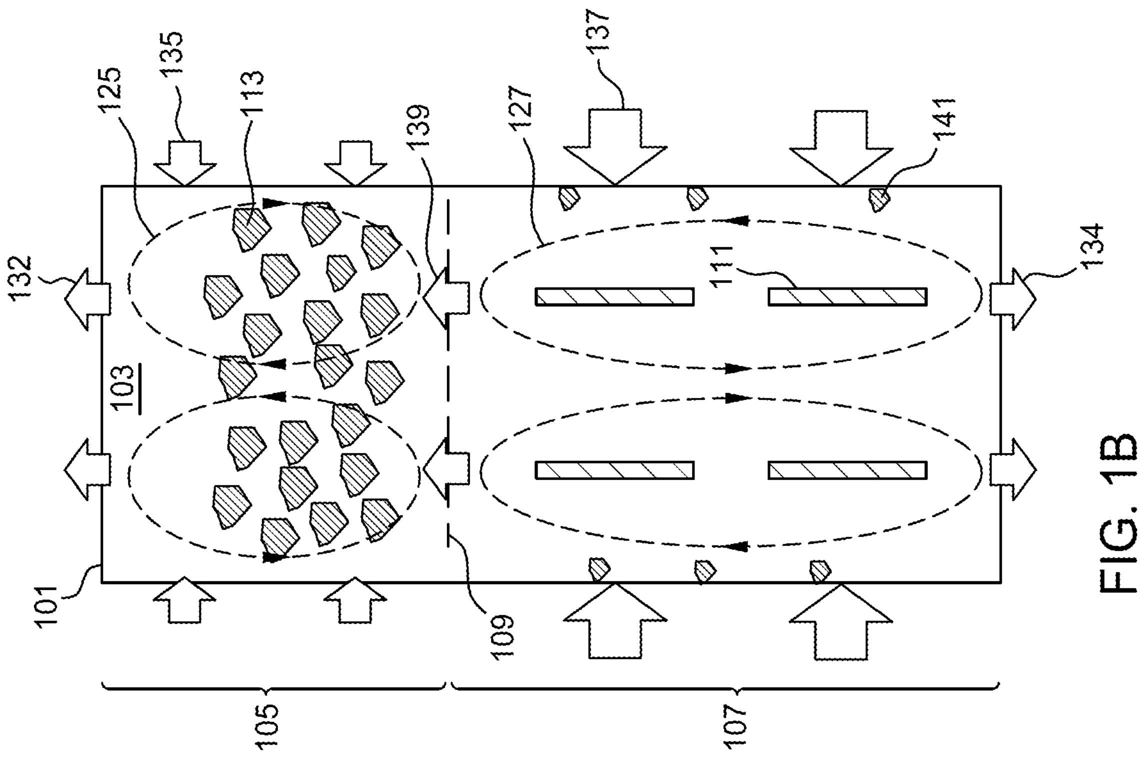
FIGS. 1A, 1B, and 1C are a schematic diagram showing heat fluxes into a growth chamber for crystals by a solvothermal process with retrograde solubility and associated wall deposition.

According to the present disclosure, techniques related to processing of materials for growth of crystals are provided. More particularly, the present disclosure provides improved heater designs and a thermal control system suitable for use in conjunction with a high-pressure vessel for crystal growth of a material having a retrograde solubility in a supercritical fluid, including crystal growth of a group III metal nitride crystal by an ammonobasic or ammonoacidic technique, but there can be others. In other embodiments, the present disclosure provides methods suitable for synthesis of crystalline nitride materials, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

The disclosure includes embodiments that may relate to an apparatus for making a composition. The disclosure includes embodiments that may relate to a method of making and/or using the composition.

Approximating language, as used herein throughout the specification and claims, may be applied to modify any quantitative representation that could permissibly vary without resulting in a change in the basic function to which it may be related. Accordingly, a value modified by a term such as "about" may be not to be limited to the precise value specified. In at least one instance, the variance indicated by the term about may be determined with reference to the precision of the measuring instrumentation. Similarly, "free" may be combined with a term; and, may include an insubstantial number, or a trace amount, while still being considered free of the modified term unless explicitly stated otherwise.

Embodiments of the disclosure include a bottom end heater design for a pressure vessel for use with crystal growth in solvothermal systems having a retrograde solubility, but similar heater designs may be useful with solvothermal systems having a normal solubility. In addition, the geometries, power densities, and the like taught for bottom end heaters may also be useful for top end heaters, that is, for heaters applied to the top end of pressure vessels. In other embodiments, it may be desirable to maintain approximately isothermal conditions throughout a pressure vessel, including both the bottom end and the top end, and end heaters of the type disclosed herein may be employed on both the bottom end and the top end. In certain embodiments, an end heater, as described in the present disclosure, may include heated components that extend into a cylindrical portion of the bottom end and/or of the top end. In other words, in some embodiments the end heater may resemble a cup shape rather than a disk shape that extends into either or both end regions of the cylindrical portion disposed between the bottom and top ends.

Figure 1A:
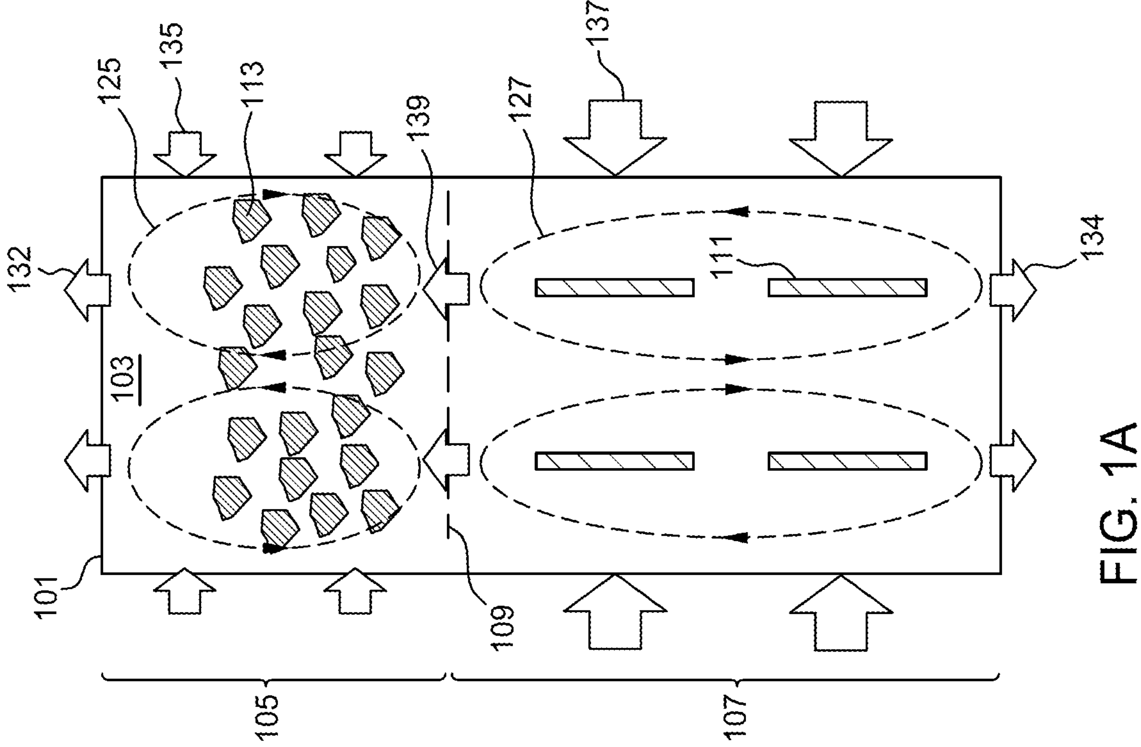
Figure 1C:
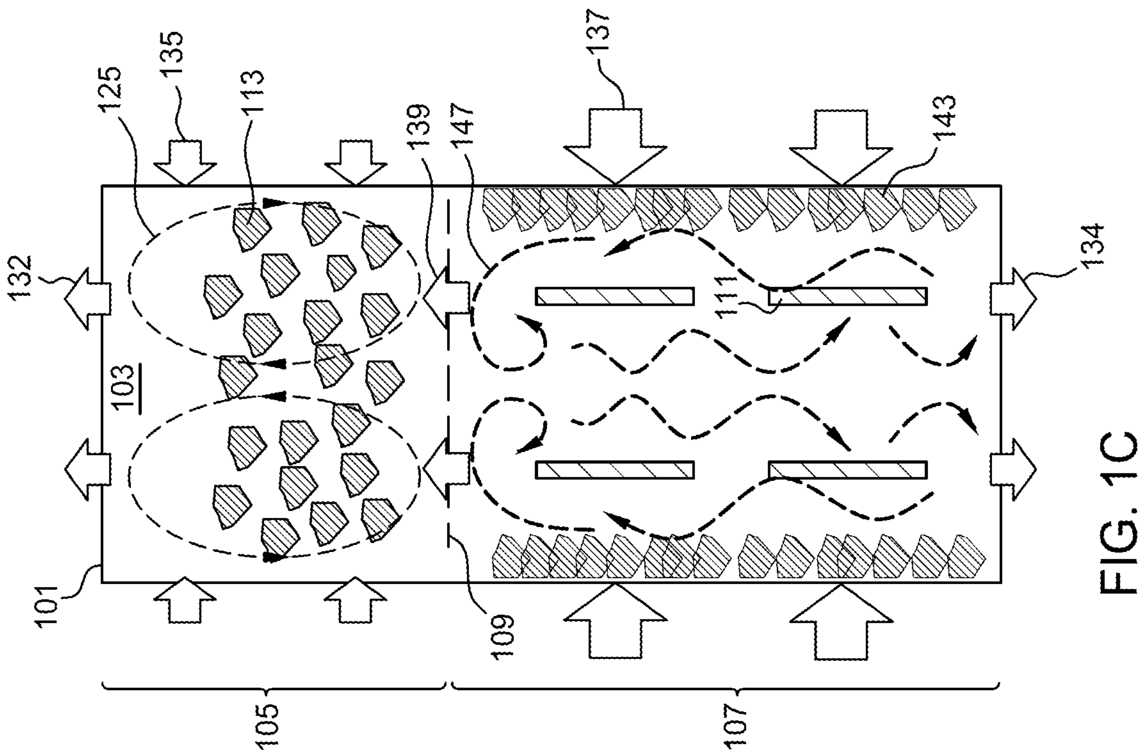

The technical challenge addressed by the present disclosure is illustrated schematically in FIGS. 1A-1C. Referring to FIG. 1A, a growth chamber 101 may include or consist of the inner surface of an autoclave or pressure vessel, the inner surface of liner within an autoclave, the inner surface of a capsule within an autoclave or within an internally-heated high-pressure apparatus, or the like. As used here, an autoclave refers to a thick-walled pressure vessel for processing materials at elevated temperature and pressures. An internally-heated high-pressure apparatus, which is also capable of processing materials at elevated temperature and pressure, may also be considered a pressure vessel, although its construction may be quite different than that of a conventional pressure vessel. The autoclave, pressure vessel, or internally-heated high pressure apparatus will normally have a cylindrical shape and be vertically oriented. The interior volume 103 is filled with a supercritical fluid, such as ammonia or water, in which a mineralizer is dissolved. Growth chamber 101 may be divided into an upper chamber 105 and a lower chamber 107 by a baffle 109. Baffle 109 may include one or more disks, conical portions, spheroidal portions, or the like, with one or more perforations and annular gaps with respect to growth chamber 101, to allow for restricted fluid motion through the baffle. One or more seed crystals 111 are suspended within lower chamber 107 from furniture (not shown), and one or more chunks of polycrystalline nutrient 113 is placed within upper chamber 105. In certain embodiments, polycrystalline nutrient 113 is placed within one or more baskets (not shown). This configuration is suitable for crystal growth in a system with retrograde solubility, with etching of polycrystalline nutrient 113 occurring in upper chamber 105 and growth of crystalline material on seed crystals 111 occurring in lower chamber 107.

Growth chamber 101 may be heated to a temperature distribution suitable for crystal growth by means of one or more electric heaters (not shown). An exemplary (prior art) heater suitable for an autoclave is described by Dwilinski (U.S. Pat. No. 6,656,615) and includes cylindrical, separately controlled hot zones surrounding upper chamber 105 and lower chamber 107. An exemplary (prior art) heater suitable for an internally heated high pressure apparatus is described by Giddings (U.S. Pat. No. 7,705,276) and includes cylindrical, separately controlled hot zones surrounding upper chamber 105 and lower chamber 107 and placed within a cylindrical high strength enclosure. Conditions suitable for crystal growth are achieved by heating lower chamber 107 to a temperature that is higher than that of upper chamber 105, causing growth zone free convection 127 to occur within lower chamber 107 and nutrient zone free convection 125 to occur within upper chamber 105. The temperature difference between lower chamber 107 and upper chamber 105 may be between about 1 degree Celsius and about 100 degrees Celsius, between about 3 degrees Celsius and about 30 degrees Celsius, or between about 5 degrees Celsius and about 20 degrees Celsius. Under steady-state growth conditions the temperature distribution within growth chamber 101 is quasi-steady state and the rate of deposition of crystalline material in lower chamber 107 is equal to the rate of etching of polycrystalline nutrient in upper chamber 105. Therefore, under steady-state conditions the net heat flux through the boundary of growth chamber 101 is zero or, put differently, heat flux inward through certain portions of the boundary of growth chamber 101 is counter-balanced by heat flow outward through other portions of the boundary of growth chamber 101. While the precise details of the heat flux distribution will depend on the precise power distribution applied to the heater, in general the growth zone heat flux 137, through the cylindrical perimeter of lower chamber 107, will flow inward, so as to enable lower chamber 107 to be hotter than upper chamber 105. For the same reason, baffle heat flux 139 will flow upward, from lower chamber 107 to upper chamber 105. In the simple case that the heater is cylindrical, the bottom heat flux 134 and the top heat flux 132, through the bottom and top portions of the boundary of growth chamber 101, respectively, will flow outward. Depending on details, nutrient zone heat flux 135, through the cylindrical perimeter of upper chamber 105, may be outward or inward.

As a consequence of the heat fluxes shown schematically in FIG. 1A, the hottest surfaces within growth chamber 101 will typically be on the perimeter of lower chamber 107. For a system with retrograde solubility, the thermodynamic driving force for deposition will be maximum on these surfaces, and therefore nuclei 141 may form on these surfaces, as shown schematically in FIG. 1B. Furthermore, since the surfaces where nuclei 141 form are the hottest surfaces within growth chamber 101, nuclei 141 will grow faster than seed crystals 111. As the crystal growth process continues, therefore, nuclei 141 may coalesce into a continuous polycrystalline film 143, as shown schematically in FIG. 1C. The roughness and thickness of continuous polycrystalline film 143 may cause modification of growth zone free convection 147. Growth on seed crystals 111 may be impeded due both to competition with continuous polycrystalline film 143 for dissolved nutrient material and to the perturbed growth zone free convection 147. In extreme cases, when the temperature difference between continuous polycrystalline film 143 and seed crystals 111 becomes large and the flux of dissolved nutrient from upper chamber 105 to lower chamber 107 is inhibited, for example, by depletion of polycrystalline nutrient 113 or clogging of one or more of holes and annular gaps within baffle 109, seed crystals can be etched rather than growing while the continuous polycrystalline film 143 continues to grow.

An additional consequence of a non-optimum temperature distribution associated with excessive temperatures in the side walls of the lower chamber 107 is that the bottom portion of lower chamber 107 may have a temperature minimum, which may give rise to stagnant fluid flow due to the suppression or disruption of the convective fluid flow currents and thus a non-optimum flow of fluid over seed crystals 111.

Figure 2:
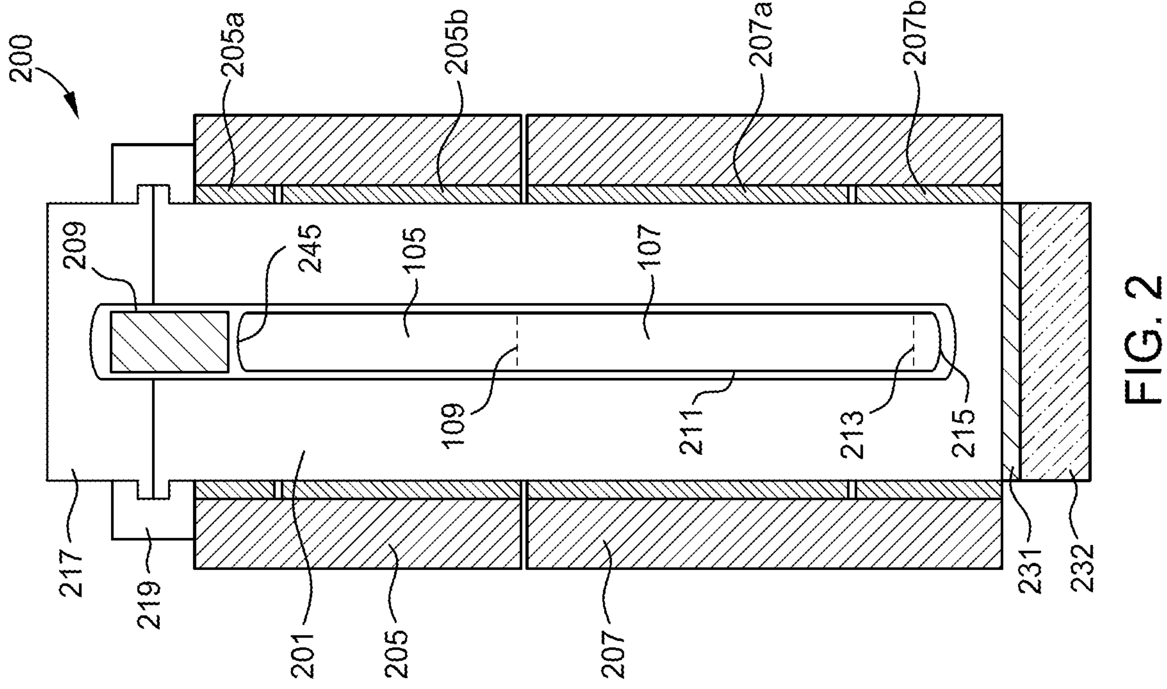
FIG. 2 is a schematic diagram showing a pressure vessel apparatus according to an embodiment of the current disclosure.

FIG. 2 is a simplified diagram of a high-pressure apparatus according to an embodiment of the present disclosure. This diagram is merely an example, which should not unduly limit the scope of the claims herein. One of ordinary skill in the art would recognize other variations, modifications, and alternatives. As shown, the present disclosure provides an apparatus for high pressure crystal or material processing, e.g., GaN, AlN, InN, InGaN, AlGaN, and AlInGaN. Other processing methods include hydrothermal crystal growth of oxides and other crystalline materials, hydrothermal or ammonothermal syntheses, and hydrothermal decomposition, and others. Of course, there can be other variations, modifications, and alternatives.

Referring to FIG. 2, a high-pressure apparatus and related methods for processing materials in supercritical fluids are disclosed. In certain embodiments, the improved heater is employed as a component of an autoclave. The autoclave may be capable of processing a material in a fluid at a pressure above about 5 MPa and below about 500 MPa, below about 400 MPa, below about 300 MPa, below about 200 MPa, or below about 100 MPa, at temperatures between about 50 degrees Celsius and about 900 degrees Celsius, such as between about 100 degrees Celsius and about 600 degrees Celsius, between about 150 degrees Celsius and about 500 degrees Celsius, or between about 200 degrees Celsius and about 400 degrees Celsius. Referring to FIG. 2, autoclave 200 includes an autoclave body 201. The upper portion of autoclave body 201 may be surrounded by at least one upper heater 205 and the lower portion of autoclave body may be surrounded by at least one lower heater 207, each of which may include insulation. Upper heater 205 may include one, two, or more independently-controllable hot zones, for example, top tail zone 205*a* and top main zone 205*b*. Lower heater 207 may include one, two, or more independently-controllable hot zones, for example, bottom main zone 207*a* and bottom tail zone 207*b*. Upper heater 205 and lower heater 207 may be physically joined into a unitary component but are typically independently controllable. In certain embodiments, a liner 211 is placed within a cavity of autoclave body 201. Liner 211 may be formed from or may include one or more of platinum, palladium, iridium, a Pt/Ir alloy, gold, or silver. Liner 211 may also include or be formed from one or more of titanium, rhenium, copper, stainless steel, zirconium, tantalum, molybdenum, niobium, alloys thereof, and the like. A baffle 109 may be positioned within liner 211, if it is present, and/or the interior of autoclave body 201. Baffle 109 may include one or more disks, conical portions, spheroidal portions, or the like, with one or more perforations and annular gaps with respect to the inner diameter of liner 211, if present, to allow for restricted fluid motion through the baffle. In certain embodiments, a bottom baffle 213 may be provided within a certain distance of the bottom surface 215 of liner 211, if the latter is present, or of the bottom inner surface of the interior of autoclave body 201. Baffle 109 and bottom baffle 213 may be formed from or may include one or more of platinum, palladium, iridium, a Pt/Ir alloy, gold, silver, titanium, rhenium, copper, stainless steel, zirconium, tantalum, molybdenum, niobium, alloys thereof, and the like. Bottom baffle 213 may have the form of a flat disk. Bottom baffle 213 may include one or more holes, which may have a diameter between about 1 millimeter and about 25 millimeters. An annular gap may be present between the outer diameter of bottom baffle 213 and the inner diameter of liner 211, if the latter is present, or of the inner diameter of autoclave body 201, if liner 211 is not present, between about 0.5 millimeter and about 25 millimeters.

In certain embodiments, autoclave 200 further includes autoclave cap 217 and closure fixture 219, as shown schematically, plus a gasket (not shown). The configuration shown in FIG. 2 is a schematic representation of a Grayloc™ seal. In other embodiments, autoclave 200 includes one or more of an unsupported Bridgman seal, an o-ring seal, a c-ring seal, a confined gasket seal, a bolted closure, an AE™ closure, an EZE-Seal™, a Keuntzel closure, a Zipper-Clave™ closure, a threadless pin closure, or a Gasche™ gasket seal. In certain embodiments, autoclave 200 further includes a cap, closure fixture, and seal on the lower end, in addition to the cap, closure fixture, and seal on the upper end.

Autoclave body 201, autoclave cap 217, and closure fixture 219 may each be fabricated from a material selected from a group consisting of steel, low-carbon steel, SA723 steel, SA266 carbon steel, 4340 steel, A-286 steel, iron based superalloy, nickel based superalloy, cobalt based superalloy, Inconel 718, Rene 41, 304 stainless steel, 310 stainless steel, 316 stainless steel, 340 stainless steel, 410 stainless steel, and 17-4 precipitation hardened stainless steel, zirconium and its alloys, titanium and its alloys, and other materials commonly known as Monel, Inconel, Hastelloy, Udimet 500, Stellite, Rene 41, and Rene 88. One or more of the components comprising autoclave body 201, autoclave cap 217, and closure fixture 219 may undergo a heat treatment operation. In certain embodiments, autoclave body 201 includes a demountable seal at the bottom as well as at the top.

Autoclave 200 further comprises a bottom end heater 231 that is thermally coupled to the bottom portion of autoclave body 201 and includes thermal insulation/bottom insulating member 232. Bottom end heater 231 generates a power distribution that is approximately azimuthally uniform about the central axis of autoclave body 201. The power level in bottom end heater 231, relative to the power level in lower heater 207 and upper heater 205, along with the radial dependence of the power density within bottom end heater 231, is chosen so as to maintain a temperature distribution along bottom surface 215 or, alternatively, along bottom baffle 213, that is uniform to within 10 degrees Celsius, within 5 degrees Celsius, within 2 degrees Celsius, within 1 degree Celsius, within 0.5 degree Celsius, or within 0.2 degree Celsius. In certain embodiments, the power level in bottom end heater 231, relative to the power level in lower heater 207 and upper heater 205, along with the radial dependence of the power density within bottom end heater 231, is chosen so as to maintain an average temperature of bottom surface 215, or bottom baffle 213, that is equal to the average temperature within a specified height range of the inner surface of liner 211, or of the inner surface of autoclave body 201 if liner 211 is not present, to within 20 degrees Celsius, within 10 degrees Celsius, within 5 degrees Celsius, within 2 degrees Celsius, or within 1 degree Celsius. The specified height range is measured with respect to the bottom surface 215. In certain embodiments the specified height is approximately 1 centimeter, 5 centimeters, 10 centimeters, 20 centimeters, or 25 centimeters. In certain embodiments, the bottom end heater 231 is configured with at least two or at least three independently-controllable hot zones.

In certain embodiments, autoclave 200 further includes a top insulator/heater 209. In certain embodiments, top insulator/heater 209 includes or consists of a load-bearing thermal insulator, for example, zirconia or another ceramic material with a low thermal conductivity. In certain embodiments, top insulator/heater also has capability to generate heat, for example, by means of electrical connections through autoclave cap 217. In certain embodiments, top insulator/heater 209 includes one or more of a cartridge heater, a cable heater, a disk heater, or the like. Top insulator/heater 209 may have finished surfaces so that it fits snugly against a lower surface of autoclave cap 217 and against top surface 245 of liner 211 and sufficient radial clearance with respect to an inner surface of autoclave body 201 for easy insertion and removal without enabling extrusion of an upper portion of liner 211 into a radial gap that is present or is formed between the inner surface of autoclave body 201 and the top insulator/heater 209 during high pressure operation. The dimensions of top insulator/heater 209 and its power level, if present, along with the power levels in lower heater 207 and upper heater 205, including a top zone within upper heater 205, along with the radial dependence of the power density within top insulator/heater 209, may be chosen so as to maintain a temperature distribution along top surface 245 that is uniform to within 10 degrees Celsius, within 5 degrees Celsius, within 2 degrees Celsius, or within 1 degree Celsius. In addition, the dimensions of top insulator/heater 209 and the power levels of upper heater 205 and lower heater 207 may be chosen to maintain top surface 245 at an average temperature that is equal to the average temperature within a specified height, measured with respect to top surface 245, of the inner surface of liner 211, or of the inner surface of autoclave body 201, if liner 211 is not present, to within 20 degrees Celsius, within 10 degrees Celsius, within 5 degrees Celsius, within 2 degrees Celsius, or within 1 degree Celsius. In certain embodiments the specified height is approximately 1 centimeter, 5 centimeters, 10 centimeters, 20 centimeters, or 25 centimeters. In certain embodiments, the top insulator/heater 209 is configured with at least two or at least three independently-controllable hot zones.

The design of bottom end heater 231, top insulator/heater 209, and the relative powers to be applied to the various independently-controllable hot zones may be guided by experimental methods, such as thermocouples or other temperature sensors at various locations on the periphery of autoclave body 201 or within growth chamber 101 and/or by theoretical methods, such as computational fluid dynamics simulations, as are known to those skilled in the art.

Figure 3:
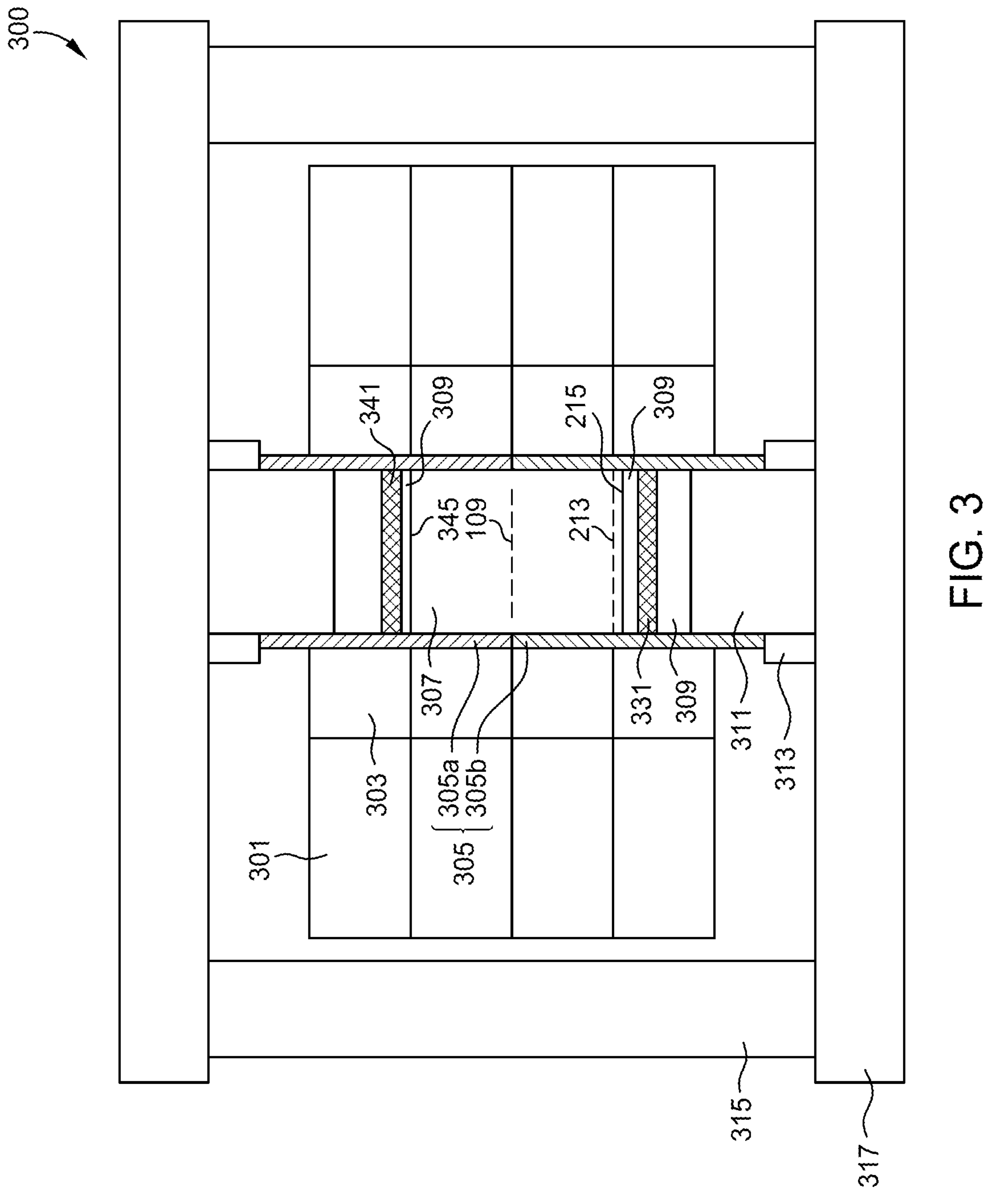
FIG. 3 is a schematic diagram showing an internally-heated pressure vessel apparatus according to an embodiment of the current disclosure.

FIG. 3 is a simplified diagram of an internally-heated high-pressure apparatus according to an embodiment of the present disclosure. This diagram is merely an example, which should not unduly limit the scope of the claims herein. One of ordinary skill in the art would recognize other variations, modifications, and alternatives. As shown, the present disclosure provides an apparatus for high pressure crystal or material processing, e.g., GaN, AlN, InN, InGaN, AlGaN, and AlInGaN. Other processing methods include hydrothermal crystal growth of oxides and other crystalline materials, hydrothermal or ammonothermal syntheses, and hydrothermal decomposition, and others. Of course, there can be other variations, modifications, and alternatives.

Referring to FIG. 3, a high-pressure apparatus and related methods for processing supercritical fluids are disclosed. In certain embodiments, the improved heater is employed as a component of an internally-heated high-pressure apparatus. The apparatus provides adequate containment in all directions which, for a typical cylindrical vessel, can be classified as radial and axial. Furthermore, depending on the specifics of the design parameters, the apparatus is capable of operating at temperatures between 200 degrees Celsius and 1500 degrees Celsius, pressures between about 5 MPa and about 2000 MPa, and for whatever length of time is necessary to grow satisfactory bulk crystals, for example, between about 1 hour and about 180 days. The internally-heated high-pressure apparatus 300 may include a stack of one or more ring assemblies to provide radial confinement, comprising a high strength enclosure ring 301 and a ceramic ring 303. The stack may include greater than 2, greater than 5, greater than 10, greater than 20, greater than 30, greater than 50, or greater than 100 ring assemblies. The stack surrounds heater or heating member 305 and capsule 307 and may be supported mechanically by at least one support plate (not shown, but see discussion below). In other words, the heating member or heater may be positioned between the capsule and one or more radial restraint structures comprise a high strength enclosure ring and a thermally-insulating, load-bearing structure, for example, a ceramic ring. The stack may provide radial confinement for pressure generated within capsule 307 and transmitted outward through heater 305. Heater 305 includes an upper heater **305*a* and a lower heater 305*b*. Each of upper heater 305*a* and lower heater 305*b* may include one, two, or more independently-controllable hot zones. Upper heater 305*a* and lower heater 305*b* may be physically joined into a unitary component but are typically independently controllable. The interior of heater 305 may define a processing chamber, into which capsule 307 may be placed. In the case that the ring assemblies in the die stack are comprised of high strength enclosure ring 301 and ceramic ring 303, there may be an interference fit between the two members in each ring assembly. Means for external cooling of the one or more ring assemblies or radial restraints may be provided. In certain embodiments, capsule 307** includes an inner capsule member and an outer capsule member (not shown, but described in more detail below).

Axial confinement of pressure generated within capsule 307 may be provided by end plugs 311, crown members 317, and tie rods or tie rod fasteners 315. End plugs 311 may comprise zirconium oxide or zirconia. Alternative end plug materials may include magnesium oxide, aluminum oxide, silicon oxide, silicon carbide, tungsten carbide, steel, nickel alloys, titanium alloys, salts, and phyllosilicate minerals such as aluminum silicate hydroxide or pyrophyllite, according to a specific embodiment. End plugs 311 may be surrounded by end plug jackets 313. End plug jackets may provide mechanical support and/or radial confinement for end plugs 311. End plug jackets 313 may also provide mechanical support and/or axial confinement for heater 305. End plug jackets 313 may comprise steel, stainless steel, an iron-based alloy, a nickel-based alloy, or the like. In certain embodiments, tie rod fasteners 315 are arranged in a configuration that provides axial loading of two or more ring assemblies. Further details are provided in U.S. Pat. Nos. 9,724,666 and 10,174,438, which are hereby incorporated by reference in their entirety.

Crown members 317 and tie rod fasteners 315 may comprise a material selected from a group consisting of steel, low-carbon steel, SA723 steel, SA266 carbon steel, 4340 steel, A-286 steel, iron based superalloy, 304 stainless steel, 310 stainless steel, 316 stainless steel, 340 stainless steel, 410 stainless steel, 17-4 precipitation hardened stainless steel, zirconium and its alloys, titanium and its alloys, and other materials commonly known as Monel, Inconel, Hastelloy, Udimet 500, Stellite, Rene 41, and Rene 88.

The internally-heated high-pressure apparatus 300 may include a pressure transmission medium 309 proximate to the axial ends of capsule 307 and to end plugs 311 according to a specific embodiment. Pressure transmission medium 309 may include multiple components, for example, one or more disks. The pressure transmission medium may comprise sodium chloride, other salts, or phyllosilicate minerals such as aluminum silicate hydroxide or pyrophyllite, or other materials, according to a specific embodiment. In certain embodiments, pressure transmission medium 309 may comprise one or more of metal halides, such as NaCl, NaBr, AgCl, AgBr, $CaF_2$, $SrF_2$, graphite, hexagonal boron nitride, talc, soapstone, gypsum, limestone, alabaster, molybdenum disulfide, calcium carbonate, magnesium oxide, zirconium oxide, merylinite clay, bentonite clays, or sodium silicate.

A baffle 109 may be positioned within capsule 307, dividing the internal volume of capsule 307 into an upper chamber and a lower chamber. Baffle 109 may include one or more disks, conical portions, spheroidal portions, or the like, with one or more perforations and annular gaps with respect to the inner diameter of capsule 307 to allow for restricted fluid motion through the baffle. In certain embodiments, a bottom baffle 213 may be provided within a certain distance of the bottom surface 215 of capsule 307. Baffle 109 and bottom baffle 213 may be formed from or may include one or more of platinum, palladium, iridium, a Pt/Ir alloy, gold, silver, titanium, rhenium, copper, stainless steel, zirconium, tantalum, molybdenum, niobium, alloys thereof, and the like. Bottom baffle 213 may have the form of a flat disk. Bottom baffle 213 may include one or more holes, which may have a diameter between about 1 millimeter and about 25 millimeters. An annular gap may be present between the outer diameter of bottom baffle 213 and the inner diameter of capsule 307 between about 0.5 millimeter and about 25 millimeters. Bottom baffle 213 may be placed within a distance of 250 millimeters, 100 millimeters, 75 millimeters, 50 millimeters, or 25 millimeters of bottom surface 215 of capsule 307.

The internally-heated high-pressure apparatus 300 may further comprise a bottom end heater 331 and/or a top end heater 341 that are thermally coupled to the bottom portion and the top portion of capsule 307, respectively. Bottom end heater 331 generates a power distribution that is approximately azimuthally uniform about the axis of heater 305 and the relative power level in bottom end heater 331, relative to the power level in lower heater **305*b* and upper heater 305*a*, along with the radial dependence of the power density within bottom end heater 331, is chosen so as to maintain a temperature distribution along bottom surface 215 or, alternatively, along bottom baffle 213, that is uniform within 10 degrees Celsius, within 5 degrees Celsius, within 2 degrees Celsius, or within 1 degree Celsius. In certain embodiments, the relative power level in bottom end heater 331, relative to the power level in lower heater 305*b* and upper heater 305*a*, along with the radial dependence of the power density within bottom end heater 331, is chosen so as to maintain an average temperature of bottom surface 215 or, alternatively, of bottom baffle 213, that is equal to the average temperature within a specified height, measured with respect to bottom surface 215, of the inner surface of capsule 307, to within 20 degrees Celsius, within 10 degrees Celsius, within 5 degrees Celsius, within 2 degrees Celsius, or within 1 degree Celsius. In certain embodiments the specified height is approximately 1 centimeter, 5 centimeters, 10 centimeters, 20 centimeters, or 25 centimeters. Top end heater 341, if present, generates a power distribution that is approximately azimuthally uniform about the axis of heater 305 and the relative power level in top end heater 341, relative to the power level in lower heater 305*b* and upper heater 305 a, along with the radial dependence of the power density within top end heater 341, is chosen so as to maintain a temperature distribution along top surface 345 that is uniform within 10 degrees Celsius, within 5 degrees Celsius, within 2 degrees Celsius, or within 1 degree Celsius. In certain embodiments, the relative power level in top end heater 341, relative to the power level in lower heater 305*b* and upper heater 305*a*, along with the radial dependence of the power density within top end heater 341, is chosen so as to maintain an average temperature of top surface 345 that is equal to the average temperature within a specified height range, measured with respect to top surface 345, of the inner surface of capsule 307**, to within 20 degrees Celsius, within 10 degrees Celsius, within 5 degrees Celsius, within 2 degrees Celsius, or within 1 degree Celsius.

Figure 4:
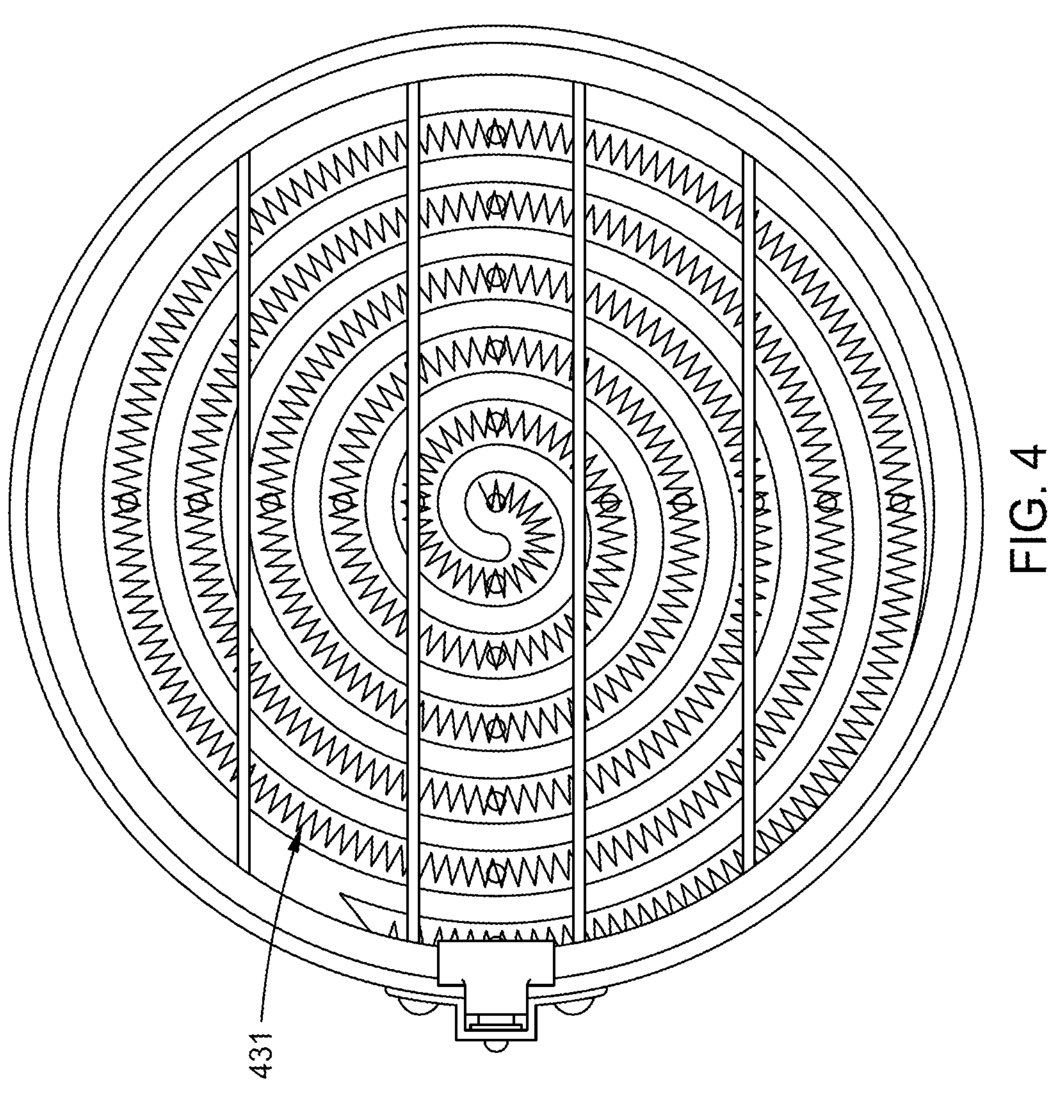
FIG. 4 is a schematic diagram showing an end heater having a spiral geometry according to an embodiment of the current disclosure.

In certain embodiments of the current disclosure, for example, the autoclave-type pressure vessel shown schematically in FIG. 2, the bottom end heater 231 does not need to support a mechanical load, as mechanical support for the weight of the pressure vessel may be provided by other components. In this case the bottom end heater may be fabricated by embedding one or more heating elements within one or more insulating members that provide thermal insulation with respect to the bottom and lateral periphery of bottom end heater 231 and electrical insulation internal to bottom end heater 231 so that electrical current flows only in an electrically isolated circuit provided by the one or more insulating members. As a point of reference, FIG. 4 shows a heater that provides a heat flux that is approximately uniform, both azimuthally and radially, between the center and the outer diameter of the heater. In this case a single heating element includes a coiled heater wire formed into a single spiral 431, with electrical contacts being provided to one end at the center and to a second end at the outer diameter. Other designs are possible, for example, where the heating element is in the form of a foil in a single spiral, double spiral, or serpentine shape, as described further below. The heating element may include or consist of a high resistivity metal alloy such as nickel-chromium, Kanthal A-1™, a Fe—Cr—Al alloy, Inconel™ 600, or the like. Moreover, one or more of the configurations provided in the present disclosure can also use heating elements using thick film and/or thin film techniques. That is, the heating element can be formed using a deposition process of filling a metal material within a groove or channel using plating (e.g., electroless, electrolytic), sputtering, evaporation (e.g., thermal, electron beam) chemical vapor deposition, or paste and/or printing techniques. Other techniques can include forming techniques using damascene techniques. Other metals that can be used to form the heating element include platinum, nickel, iron, cobalt, chromium, titanium, tungsten, molybdenum, niobium, tantalum, graphite, any combinations, and alloys thereof. Again, there are other alternatives, variations, and modifications.

The power density as a function of radius may be increased in certain regions by decreasing the spacing between adjacent windings of the spiral and/or by decreasing the cross-sectional area of the resistive heating element within these regions. Conversely, the power density as a function of radius may be decreased in certain regions by increasing the spacing between adjacent windings of the spiral and/or by increasing the cross-sectional area of the resistive heating element within these regions. Additional configurations of the heating element within the bottom end heater are described below.

In other embodiments of the current disclosure, for example, an internally-heated high-pressure apparatus as shown schematically in FIG. 3, the bottom end heater 331 does need to support a mechanical load, as bottom end heater 331 experiences approximately the same pressure as is present in capsule 307 due to the presence of the supercritical fluid at high temperature, for example, a temperature between about 200 degrees Celsius and about 1500 degrees Celsius. In this case the heater must be able to operate in the presence of a high pressure without significant deformation, to bring electrical current into and out of the balance of internally-heated high-pressure apparatus 300, and to generate the desired power as a function of radius.

Figure 5:
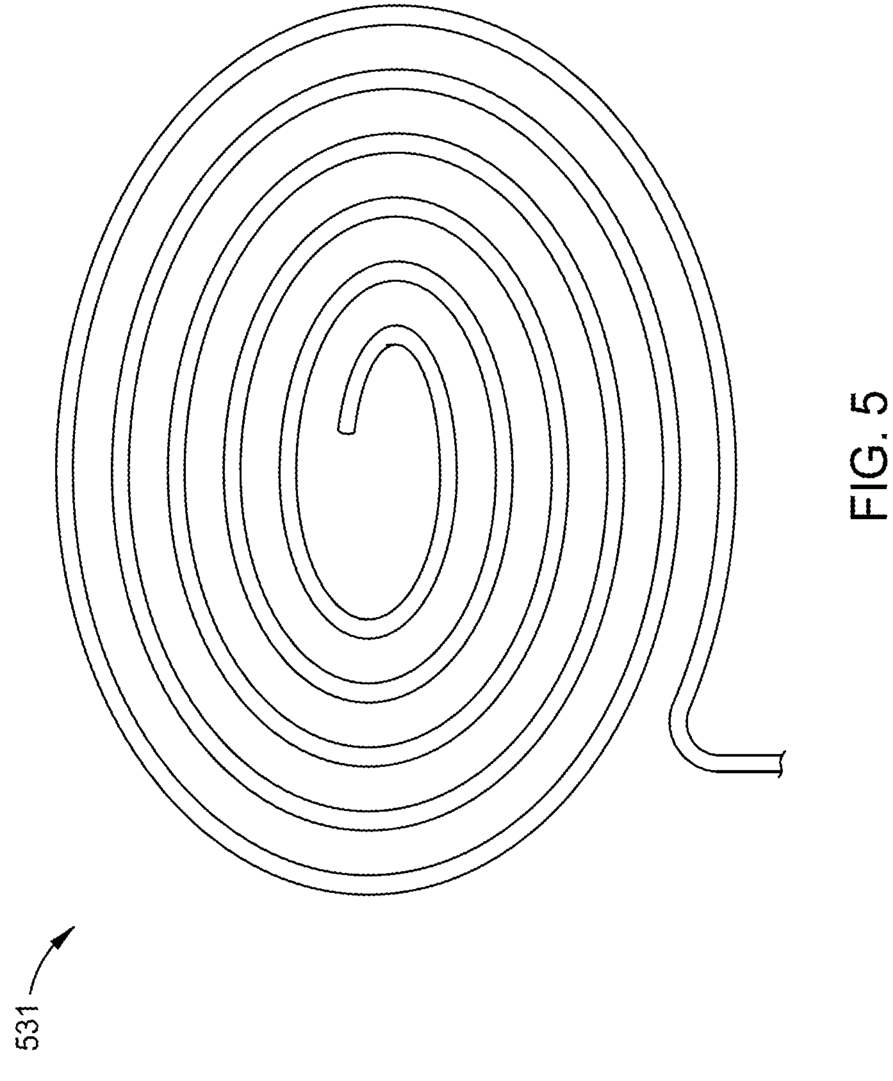
FIG. 5 is a schematic diagram showing an end heater having a spiral geometry according to another embodiment of the current disclosure.

In one specific embodiment, bottom end heater 331 includes a cable heating element that has been wound into a single spiral 531, as shown schematically in FIG. 5. The cable heating element may be purchased commercially and may include an internal heating wire, such as nichrome, embedded in a matrix, such as MgO, and contained within a flexible jacket, such as stainless steel or Incoloy™. One or more portions of the cable heater outside of the spiral may be unheated, that is, may include electrical conductors having a lower resistance per unit length than the heating wire(s) within the spiral portion of the heater. Such a configuration can provide an azimuthally-symmetric heat flux that is approximately uniform between an inner diameter of the spiral and an outer diameter of the spiral, if the spacing between adjacent winds of the spiral is uniform. The power flux as a function of radius can be varied by arranging the spacing between adjacent winds of the spiral to increase or decrease as a function of radial distance from the center. Mechanical support for the spiral heater shown in FIG. 5, including enabling axial loading without a significant volume decrease and maintaining precise control of the spacing between adjacent winds of the spiral, can be provided by embedding the spiral-shaped cable heater within a support member with a spiral groove machined therein, such that the flat portion of the spiral fits snugly within the grooves. The support member may be fabricated from a material with a high compressive strength, such as steel or Inconel 718. For example, a diametric clearance between an outer diameter of the spiral portion of the heating element and an inner diameter of the groove in the support member may be between about 0.001 inch and about 0.050 inch, or between about 0.005 inch and about 0.020 inch. Referring again to FIG. 3, the power leads, plus one or more embedded thermocouples, can be accessed by cutting a groove at the outer diameter of one or more components of pressure transmission medium 309 and lower end plug 311 and, if necessary, cutting a notch in the lower end of heater 305. Additional materials, for examples, materials similar to those used in pressure transmission medium 309, can be included in bottom end heater 331.

Figure 6:
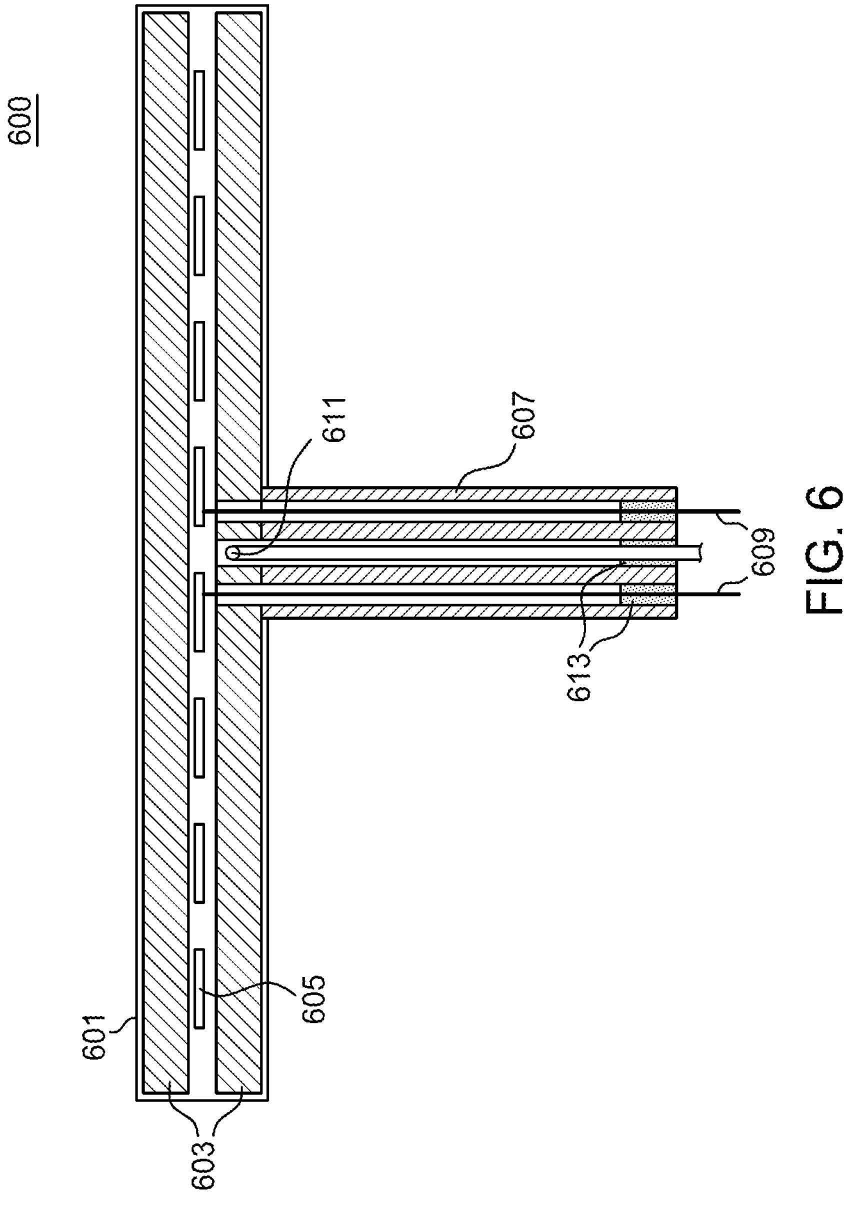
FIG. 6 is a schematic diagram showing a cross section of an end heater according to an embodiment of the current disclosure.

In certain embodiments, bottom end heater 331 is fabricated as a custom component. One specific example is shown schematically in FIG. 6. Heater 600 includes at least one heating element 605, which is enclosed within at least one or at least two insulating members 603 and encased within a jacket 601. Power leads 609 may be positioned within insulating sleeve 607 and make electrical contact with heating element 605 at at least two positions. Electrical contact between power leads 609 and heating element 605 may be made by fusion welding, soldering, brazing or other metal-joining techniques. Contact can also be maintained through mechanical force, such as from a spring or a spring combined with a transfer rod. Optionally, one or more thermocouples or temperature sensors 611 may be positioned proximate to heating element 605 and/or within insulating sleeve 607. In certain embodiments, heating element 605 includes or consists of one or more of nickel-chromium, Kanthal A-1™, a Fe—Cr—Al alloy, Inconel™ 600, graphite, platinum, or the like. In certain embodiments, heating element 605 includes or consist of a conductive ceramic, such as silicon carbide or zirconia. In certain embodiments, heating element 605 includes or consists of material in the form of a foil or a wire. In other embodiments, heating element 605 is formed using thick film and/or thin film techniques. That is, the heating element can be formed using a deposition process of filling a metal material using plating (e.g., electroless, electrolytic), sputtering, evaporation (e.g., thermal, electron beam) chemical vapor deposition, or paste and/or printing techniques. Other techniques can include forming techniques using damascene techniques. Other metals that can be used to form the heating element include platinum, nickel, iron, cobalt, chromium, titanium, tungsten, molybdenum, niobium, tantalum, graphite, any combinations, and alloys thereof. Again, there are other alternatives, variations, and modifications that are possible. In certain embodiments, power leads 609 include or consist of the same material as heating element 605. In certain embodiments, power leads 609 have a larger cross section, in a direction perpendicular to electrical current flow, than one or more portions of heating element 605. In certain embodiments, power leads 609 include or consist of a material having a lower resistivity than one or more materials within heating element 605. In a specific embodiment, power leads 609 include one or more of nickel, copper, or silver. In certain embodiments, insulating members 603 and insulating sleeve 607 include or consist of materials having a resistivity at room temperature greater than about $10^5$ Ω-cm, greater than about $10^7$ Ω-cm, greater than about $10^9$ Ω-cm, or greater than about $10^{11}$ Ω-cm. In certain embodiments insulating members 603 and insulating sleeve 607 include or consist of one or more materials selected from alumina, steatite, silica, pyrophyllite, mica, boron nitride, pyrolytic boron nitride, aluminum nitride, aluminosilicate, borosilicate, silicon carbide, silicon nitride, mullite, cordierite, or forsterite. In certain embodiments, at least one of insulating members 603 includes or consists of a bulk ceramic, glass, or glass-ceramic element. In certain embodiments, at least one of insulating members 603 includes or consists of a thin or thick film. In certain embodiments, insulating sleeve 607 includes or consists of a single-bore, double-bore, or four-bore ceramic tube. Jacket 601 may include or consist of one or more of stainless steel, Inconel 718, Inconel 600, iron, nickel, molybdenum, titanium, and tantalum, and alloys thereof. The jacket may include a closed surface with respect to the internals of the internally-heated pressure vessel, or the jacket may be open to allow through-passage of other independent elements or probes. In the case of an open surface, in preferred embodiments provision is made to prevent contact between electrically active elements in the circuit and deleterious mobile substances or vapors, such as one or more of a solvent, a mineralizer, or dissolved nutrients. In certain embodiments, feedthrough seals 613 are provided between one or more of power leads 609 and insulating sleeve 607 and/or between one or more of temperature sensor 611 or leads thereto. In certain embodiments, jacket 601 is hermetically sealed, and sealed with respect to insulating sleeve 607 so that heating element 605 is encased within a controlled atmosphere with respect to both ambient air and the interior of the internally-heated high-pressure apparatus 300. Isolation of heating element 605 from air and from the interior atmosphere of internally-heated high-pressure apparatus 300 may lead to both superior electrical performance, for example, reduced ground currents, and increased lifetime.

Figure 7A:
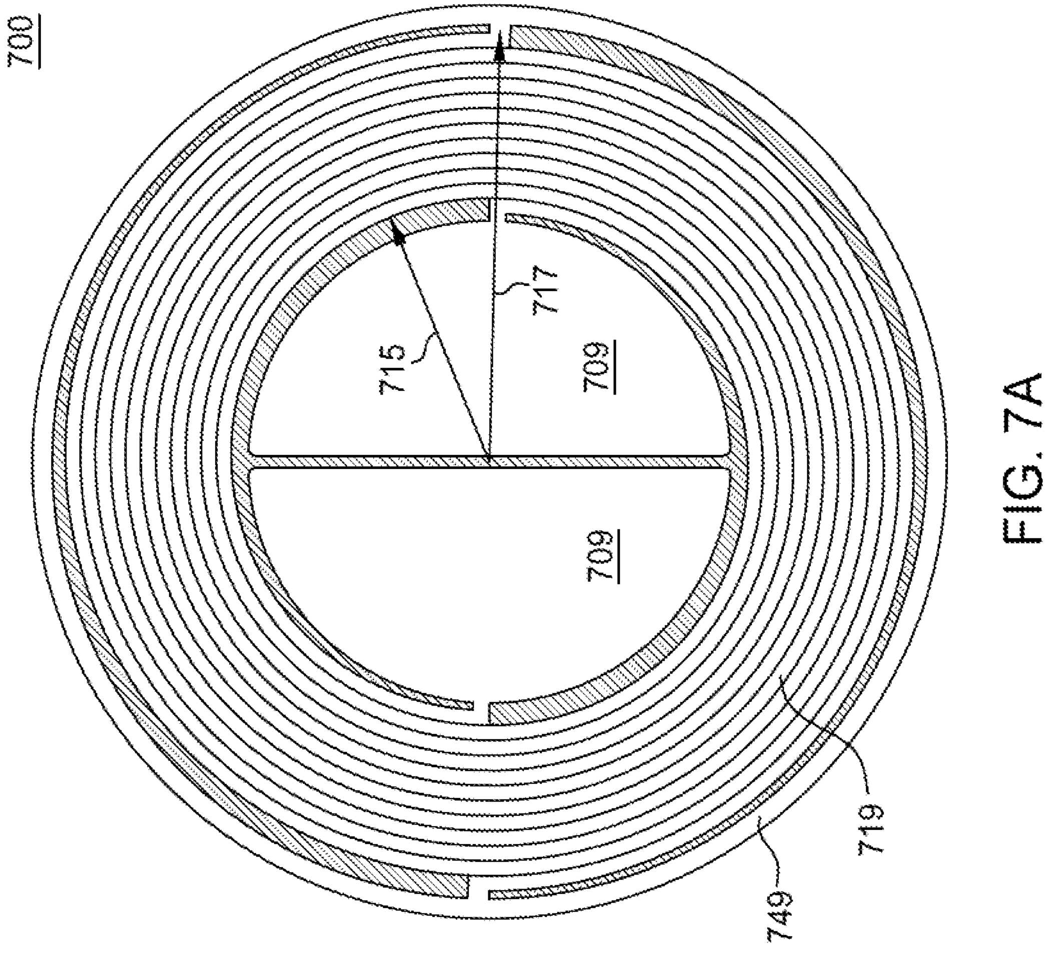
FIGS. 7A and 7B are schematic diagrams showing a heating element for an end heater that have a double-spiral geometry, according to certain embodiments of the current disclosure.
Figure 7B:
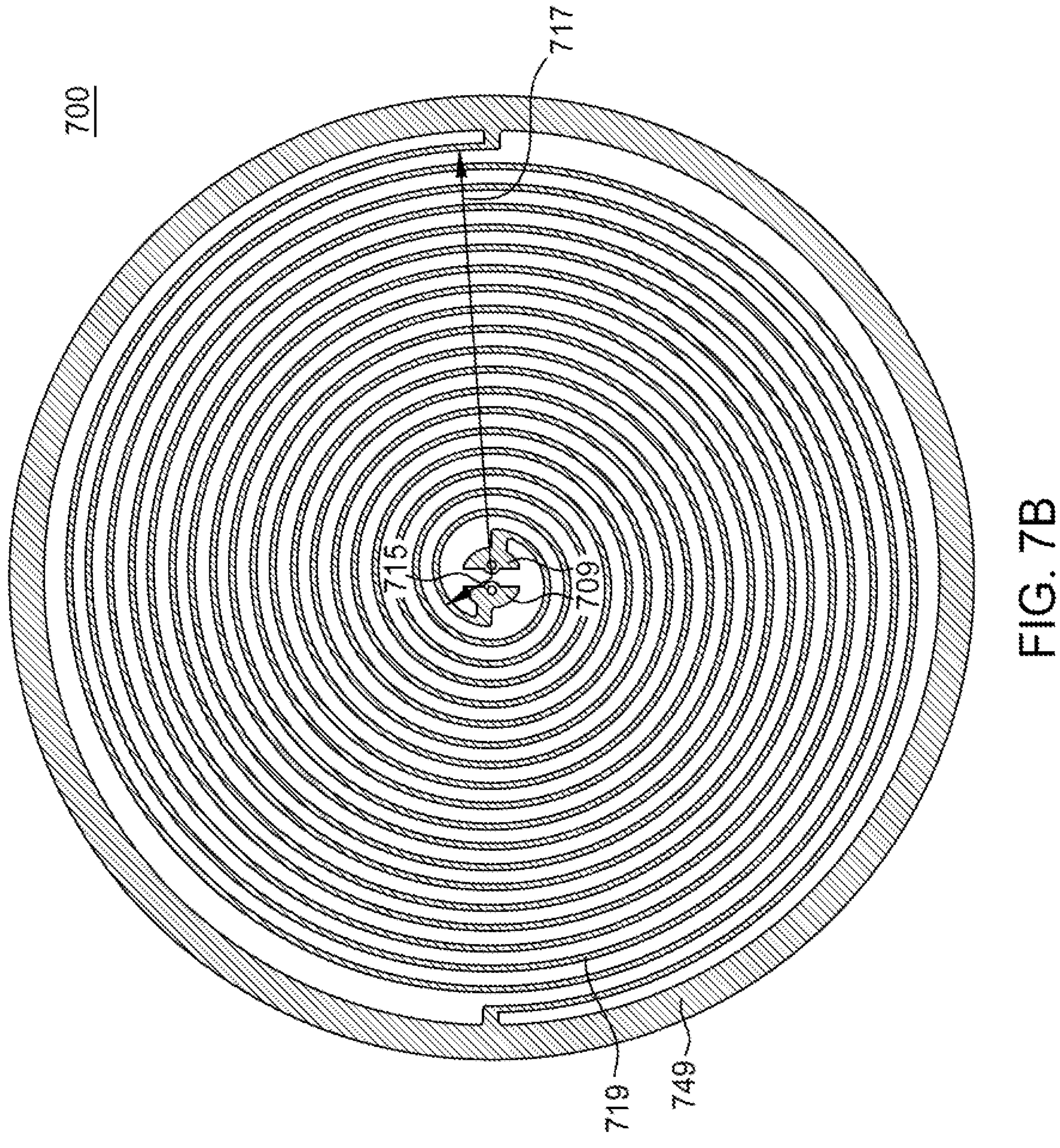

Provision of electrical leads to heater 600 near its radial center offers certain advantages for bringing the leads through the enclosure of a pressure vessel, such as that shown schematically in FIG. 3, but can complicate the design for the heating element. Some illustrative examples are shown in FIGS. 7A-7F. Referring to FIG. 7A, heating element 700 can take the form of a double spiral, with both contacts 709 near the center and a connection between one half-element and the other half-element near the periphery. The power density may be approximately uniform azimuthally, for example, to within about 20%, to within about 10%, or to within about 5%, and may be approximately uniform between inner radius 715 and outer radius 717 if the width of the double spiral segments 719 is approximately constant and the spacing between adjacent double spiral segments 719 is approximately constant, as a function of radius. In certain embodiments, the power density as a function of radius is caused to increase between the inner radius 715 and outer radius 717 by decreasing the cross-sectional area of double spiral segments 719 in a direction perpendicular to the direction of electrical current flow and/or by decreasing the spacing between adjacent double spiral segments 719 for increasing radius. In certain embodiments, the power density as a function of radius is caused to decrease between inner radius 715 and outer radius 717 by increasing the cross-sectional area of double spiral segments 719 in a direction perpendicular to the direction of electrical current flow and/or by increasing the spacing between adjacent double spiral segments 719 for increasing radius. In certain embodiments, the power density as a function of radius is caused to increase within a first portion of radius values between inner radius 715 and outer radius 717 and to decrease within a second portion of radius values between inner radius 715 and outer radius 717.

In certain embodiments, as shown schematically in FIG. 7A, the power density is lower, by least 25%, by at least 50%, by at least 75%, or by at least 90%, within an inner radius 715 than it is between inner radius 715 and outer radius 717, and inner radius 715 has a value that is between about 10% and about 99%, between about 20% and about 98%, between about 30% and about 97%, between about 40% and about 96%, between about 50% and about 95%, or between about 60% and about 90% of the value of outer radius 717. In a specific embodiment, as shown in FIG. 7A, inner radius 715 has a value that is between about 40% and about 60% of the value of outer radius 717 and the power density within the inner radius 715 is at least 75% lower than it is between inner radius 715 and outer radius 717. In other embodiments, as shown schematically in FIG. 7B, the value of inner radius 715 is less than about 10%, less than about 5%, or less than about 2% of the value of outer radius 717. In this way the power density may be approximately radially uniform as well as being approximately azimuthally uniform, except possibly for an area that is quite small in comparison to the area of the overall heater, for example, less than about 5%, less than about 2%, or less than about 1%. In this context, "approximately uniform" may refer to a value that is constant to within about 20%, to within about 10%, or to within about 5%, or to within about 2%.

Figure 7C:
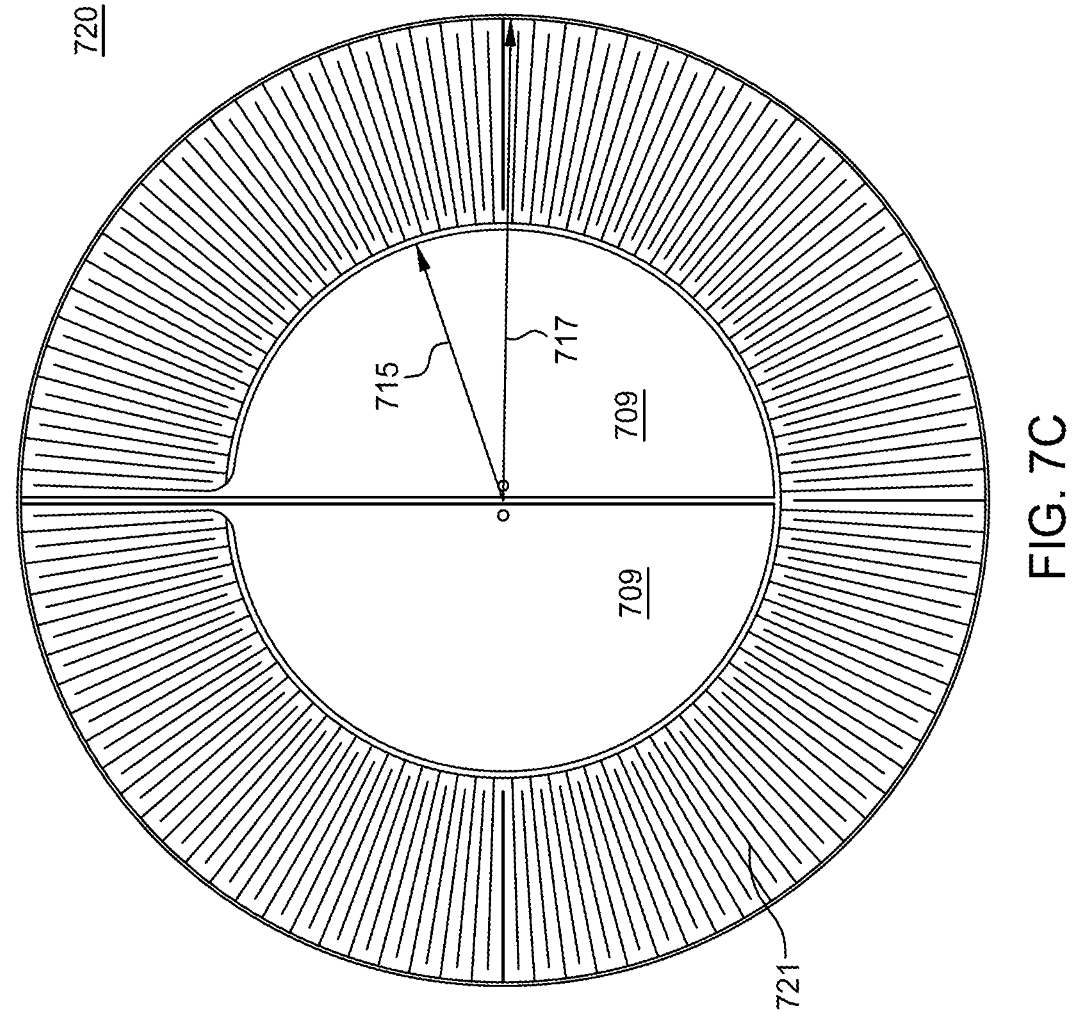
FIG. 7C is a schematic diagram showing a heating element for an end heater that has an azimuthally-serpentine geometry, according to an embodiment of the current disclosure.

Referring now to FIG. 7C, heating element 720 can take an azimuthally-serpentine structure, with both contacts 709 near the center and a serpentine arrangement around the periphery. The power density may be approximately uniform azimuthally and may be approximately uniform between inner radius 715 and outer radius 717 if the width of individual serpentine segments 721 is approximately constant and the spacing between adjacent individual serpentine segments 721 is approximately constant, as a function of radius. In certain embodiments, the power density as a function of radius is caused to increase between inner radius 715 and outer radius 717 by decreasing the cross-sectional area of individual serpentine segments 721 in a direction perpendicular to the direction of electrical current flow and/or by decreasing the spacing between adjacent individual serpentine segments 721 for increasing radius. In certain embodiments, the power density as a function of radius is caused to decrease between inner radius 715 and outer radius 717 by increasing the cross-sectional area of individual serpentine segments 721 in a direction perpendicular to the direction of electrical current flow and/or by increasing the spacing between adjacent individual serpentine segments 721 as the radius increases. In certain embodiments, the power density as a function of radius is caused to increase within a first portion of radius values between inner radius 715 and a radius that is intermediate between inner radius 715 and outer radius 717, and to decrease within a second portion of radius values between the intermediate radius and outer radius 717. In a specific embodiment, the power density as a function of radius increases gradually, by a factor between 20% and 200%, as the radius increases from inner radius 715 to an intermediate radius that lies between about 20% and 80% of the way from inner radius 715 to outer radius 717, and then decreases gradually as the radius increases further from the intermediate radius to outer radius 717.

Figure 7D:
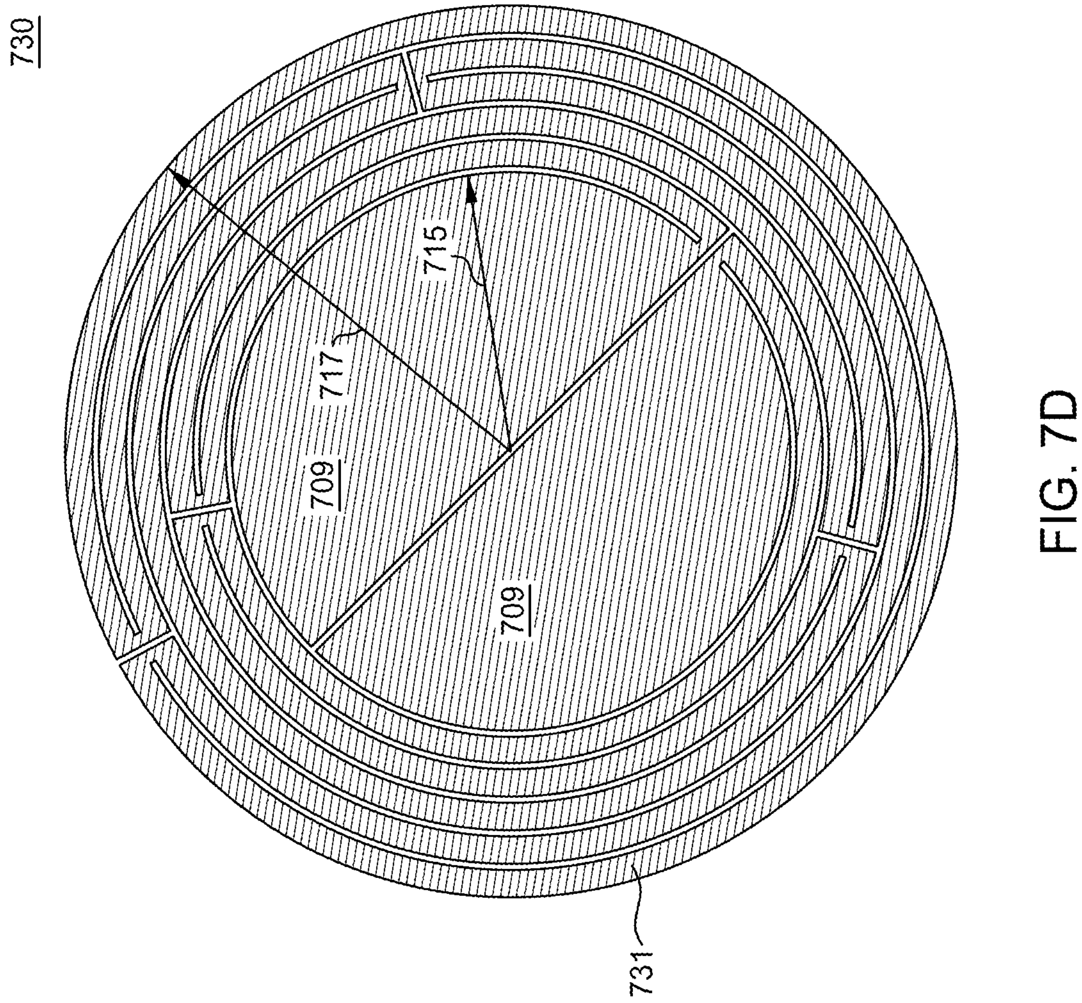
FIGS. 7D and 7E are schematic diagrams showing a heating element for an end heater that has a labyrinthine geometry, according to certain embodiments of the current disclosure.
Figure 7E:
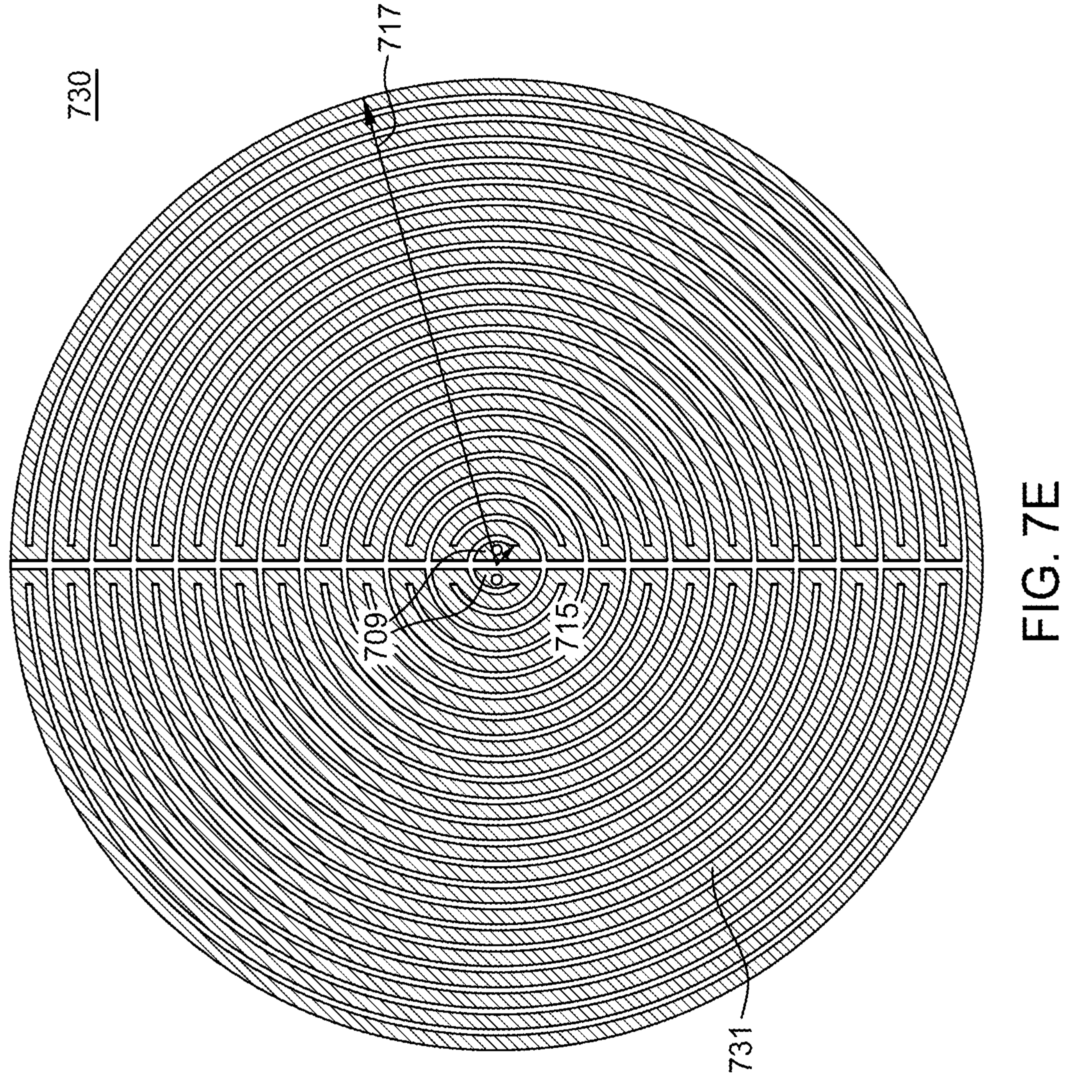

Referring now to FIG. 7D, heating element 730 can take a labyrinthine structure, with both contacts 709 near the center and a labyrinthine arrangement outward to the periphery. The power density may be approximately uniform azimuthally and may be approximately uniform between inner radius 715 and outer radius 717 if the width of individual labyrinthine segments 731 is approximately constant and the spacing between adjacent individual labyrinthine segments 731 is approximately constant, as a function of radius. In certain embodiments, the power density as a function of radius is caused to increase between inner radius 715 and outer radius 717 by decreasing the cross-sectional area of individual labyrinthine segments 731 in a direction perpendicular to the direction of electrical current flow and/or by decreasing the spacing between adjacent individual labyrinthine segments 731 for increasing radius. In certain embodiments, the power density as a function of radius is caused to decrease between inner radius 715 and outer radius 717 by increasing the cross-sectional area of individual labyrinthine segments 731 in a direction perpendicular to the direction of electrical current flow and/or by increasing the spacing between adjacent individual labyrinthine segments 731 for increasing radius. In certain embodiments, the power density as a function of radius is varied by alternating between a straight and a zig-zag element structure and/or by changing the pitch of a zig-zag structure. Other means of variation are also possible and are included within the scope of the current disclosure. In certain embodiments, the power density as a function of radius is caused to increase within a first portion of radius values between inner radius 715 and a radius that is intermediate between inner radius 715 and outer radius 717 and to decrease within a second portion of radius values between the intermediate radius and outer radius 717. In a specific embodiment, the power density as a function of radius increases gradually, by a factor between 20% and 200%, as the radius increases from inner radius 715 to an intermediate radius that lies between about 20% and 80% of the way from inner radius 715 to outer radius 717, and then decreases gradually as the radius increases further from the intermediate radius to outer radius 717.

In certain embodiments, as shown schematically in FIG. 7D, the power density is much lower within an inner region defined by an inner radius 715 than it is between an outer region defined between the inner radius 715 and an outer radius 717, and inner radius 715 has a value that is between about 3% and about 99.8%, between about 5% and about 99.5%, between about 10% and about 99%, between about 20% and about 98%, between about 30% and about 97%, between about 40% and about 96%, between about 50% and about 95%, or between about 60% and about 90% of the value of outer radius 717. In a specific embodiment, as shown in FIG. 7D, inner radius 715 has a value that is between about 40% and about 60% of the value of outer radius 717 and the power density within inner radius 715 is at least 75% lower than it is between inner radius 715 and outer radius 717. In other embodiments, as shown schematically in FIG. 7E, the value of inner radius 715 is less than about 10%, less than about 5%, or less than about 2% of the value of outer radius 717. In this way the power density may be approximately radially uniform as well as being approximately azimuthally uniform, except possibly within an area that is quite small in comparison to the area of the overall heater, for example, less than about 5%, less than about 2%, or less than about 1%.

Figure 7F:
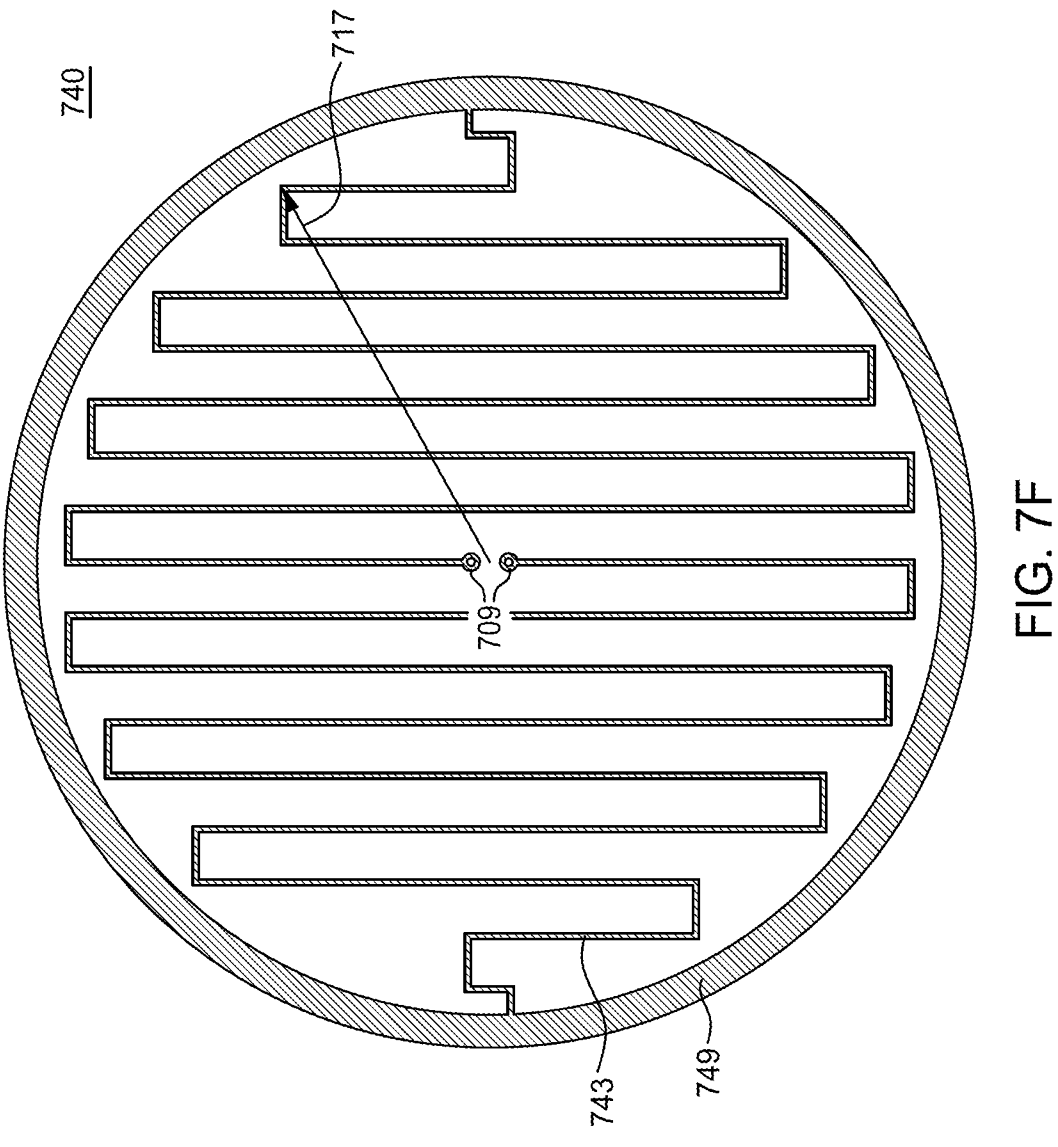
FIG. 7F is a schematic diagram showing a heating element for an end heater that has a linearly-serpentine geometry, according to an embodiment of the current disclosure.

Other arrangements of the heating element are also possible. For example, a heating element may contain combinations of spiral, azimuthally-serpentine, and labyrinthine elements or members. In a case where an approximately-uniform power density is desired, except possibly within an area that is quite small in comparison to the area of the overall heater, for example, less than about 5%, less than about 2%, or less than about 1%, a quasi-one-dimensional linearly-serpentine, or butterfly, arrangement is possible, as shown schematically in FIG. 7F. Referring to FIG. 7F, heating element 740 may have both contacts 709 near the center and a connection between one half-element and the other half-element near the periphery 749. The power density may be approximately uniform azimuthally and may be approximately uniform within outer radius 717 if the width of the linearly-serpentine segments 743 is approximately constant and the spacing between adjacent linearly-serpentine segments 743 is approximately constant.

Figure 8:
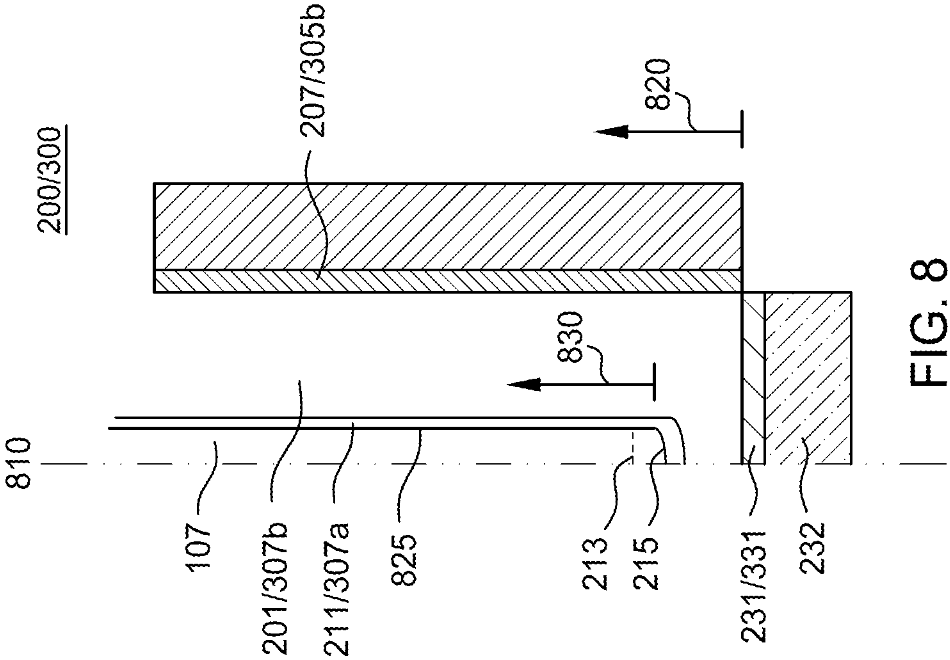
FIG. 8 is a schematic diagram showing the bottom portion of a pressure vessel, according to certain embodiments of the current disclosure.

In order to design the optimum power density distribution and power level for the bottom end heater it is useful to perform detailed temperature measurements and modeling calculations. FIG. 8 is a schematic illustration of the bottom portion of a pressure vessel, for example, the autoclave 200 of FIG. 2 or the internally-heated high-pressure apparatus 300 of FIG. 3. The lower portion of lower chamber 107, with centerline 810, may be surrounded radially by liner 211 or by inner capsule 307*a*, which may in turn be surrounded radially by autoclave body 201 or by outer capsule 307*b* and, additionally, by lower heater 207 or 305*b*. The lower portion of lower chamber 107, with centerline 810, may be bounded axially by bottom surface 215 of liner 211 or inner capsule 307*a* and by the bottom portion of autoclave body 201 or outer capsule 307*b* and, additionally, by bottom end heater 231 or 331.

Figure 9B:
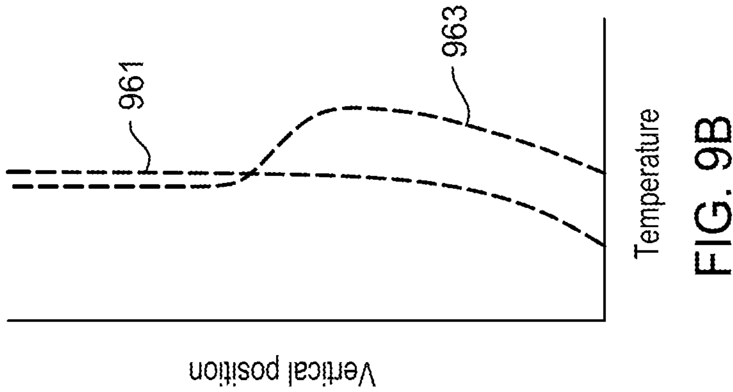
FIG. 9B is a schematic diagram showing the resultant temperature distributions based on the two provided power densities shown in FIG. 9A along the inner diameter of the pressure vessel, according to certain embodiments of the current disclosure.
Figure 9A:
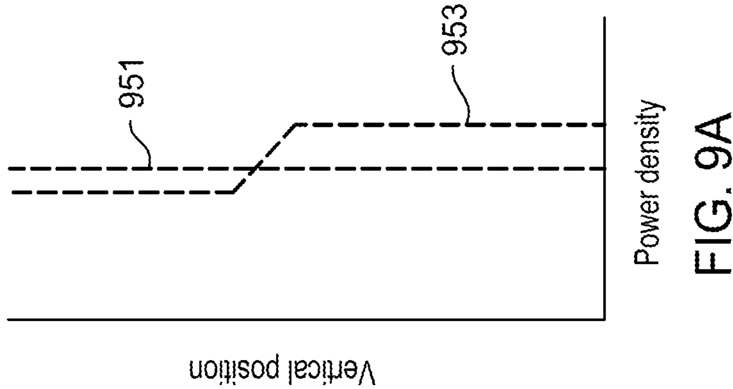
FIG. 9A is a schematic diagram showing two power densities as a function of vertical position in a cylindrical heater for a pressure vessel, according to certain embodiments of the current disclosure.

As a point of reference, FIG. 9A is a schematic illustration showing two cases of the power density of lower heater 207/305*b* as a function of vertical position 820 (cf. FIG. 8) from the bottom of autoclave body 201 or outer capsule 307*b*. FIG. 9B is a schematic illustration showing the corresponding temperatures along inner surface 825 of liner 211 or inner capsule 307 a as a function of vertical position 830 from the bottom inner diameter of lower chamber 107. In certain embodiments, the power density in lower heater 207/305*b* is approximately constant, as shown in case 951 in FIG. 9A. Because of axial heat loss from the bottom of the pressure vessel, in general, such a power distribution will cause the temperature profile for this case to decrease near the bottom of surface 925, as shown in case 961 in FIG. 9B. Such a temperature distribution may be undesirable, as it can give rise to a stagnant fluid near the bottom of lower chamber 107. A temperature minimum near the bottom of lower chamber 107 may be avoided by adding additional power near the bottom of lower heater 207/305*b*, for example, via an independently-controllable hot zone, that is formed by using a lower heater having at least two hot zones. An example of such a power density variation is shown schematically in case 953 in FIG. 9A. The use of an elevated power density near the lower end of lower heater 207/305*b* may avoid a pronounced minimum in temperature at the bottom of lower chamber 107 but will typically give rise to a local maximum temperature along the side wall, as shown schematically in case 963 in FIG. 9B. As described above, such a temperature distribution may give rise to undesirably-high wall deposition in retrograde solvothermal crystal growth processes, as described above.

The design of bottom end heater 331, top end heater 341, and the relative powers to be applied to the various independently-controllable hot zones may be guided by experimental methods, such as thermocouples or other temperature sensors at various locations on the periphery of an internally-heated high-pressure apparatus 300 or within growth chamber 101 and/or by theoretical methods, such as computational fluid dynamics simulations, as are known to those skilled in the art.

For purposes of designing the optimum power density distribution and power level to the bottom end heater, it is desirable to have a validated model for the relationship between heater power and temperature distribution. For example, referring again to FIG. 2, a validated model should be capable of accurately calculating the temperature distribution throughout autoclave body 201 and along the inner surface of liner 211, along bottom surface 215, and along bottom baffle 213 as a function of the power levels applied to one or more hot zones within each of lower heater 207 and upper heater 205. Such a calculation can be performed using a commercial computational fluid dynamics program such as ANSYS FLUENT™, StarCCM™, CFD-ACE™, or the like. Literature values of material properties such as density, thermal conductivity, heat capacity, viscosity, etc., can be used for the materials of construction of the autoclave and of the heaters, and also for the supercritical fluid, for example, water or ammonia. Typically, assumptions will need to be made for the heat transfer coefficients (or film coefficients) of surface exposed to air, as heat transfer associated with free convection can vary, depending on variables that may be difficult to measure. These assumptions, together with the material properties used in the calculations, can be validated by performing temperature measurements on many surfaces as a function of applied heater power levels and adjusting the assumptions as needed to obtain good agreement between calculated and measured temperatures. For example, temperatures at various positions on the outer periphery and along the bottom of autoclave body 201 may be measured using contact thermocouples. In certain embodiments, measurements may also be performed within upper chamber 105, lower chamber 107, and at one more positions on the inner surface of liner 211 by providing internal thermocouples, which may be interfaced to feedthroughs provided within autoclave cap 217.

Similarly, referring again to FIG. 3, a validated model should be capable of accurately calculating the temperature distribution throughout capsule 307 and along its inner surface, along bottom surface 215, and along bottom baffle 213 as a function of the power levels applied to one or more hot zones within each of lower heater 305*b* and upper heater 305*a*. Such a calculation can be performed using a commercial computational fluid dynamics program such as ANSYS FLUENT™, StarCCM™, CFD-ACE™, or the like. Literature values of material properties such as density, thermal conductivity, heat capacity, viscosity, etc., can be used for the materials of construction of the internally heated pressure vessel and of the heaters, and also for the supercritical fluid, for example, water or ammonia. Typically, assumptions will need to be made for the heat transfer coefficients (or film coefficients) of surface exposed to air, as heat transfer associated with free convection can vary, depending on variables that may be difficult to measure. These assumptions, together with the material properties used in the calculations, can be validated by performing temperature measurements on many surfaces as a function of applied heater power levels and adjusting the assumptions as needed to obtain good agreement between calculated and measured temperatures. For example, temperatures at various positions on the outer periphery and along the upper and lower surfaces of high strength enclosure rings 301 and of crown members 317 may be measured using contact thermocouples. In certain embodiments, measurements may also be performed within upper chamber 105, lower chamber 107, and at one more positions on the inner surface of liner 211 by providing internal thermocouples.

EXAMPLES

Embodiments provided by the present disclosure are further illustrated by reference to the following examples. It will be apparent to those skilled in the art that many modifications, both to materials and methods, may be practiced without departing from the scope of the disclosure.

Example 1

Figures 10A, 10B:
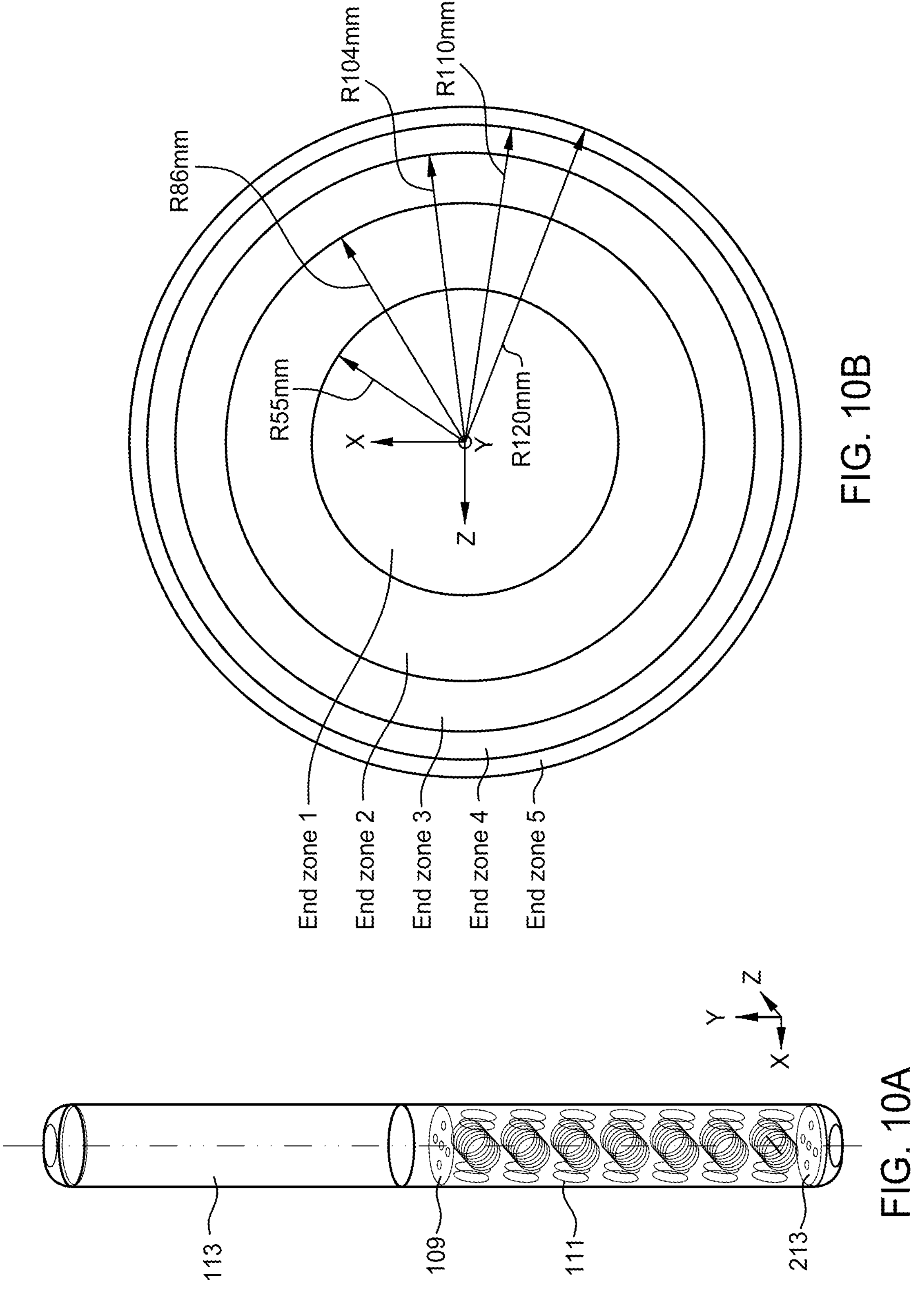
FIG. 10A is a schematic diagram showing the layout of the interior of a growth chamber of an autoclave, including nutrient material, baffles, and seed crystals, according to an embodiment of the current disclosure.
FIG. 10B is a schematic diagram showing five hot zones within a bottom end heater according to a specific embodiment of the current disclosure.

An autoclave, similar to that shown schematically in FIG. 2, is provided. The autoclave has an inner diameter of 120 millimeters, an outer diameter of 240 millimeters, has an inner height of 1200 millimeters high, and an outer height of 1320 millimeters. The autoclave, on its outer cylindrical surface, is fitted with a four-zone cylindrical heater. The lengths of the heating zones, measured along the long axis of the autoclave, are 220 millimeters (bottom tail zone 207*b*), 440 millimeters (bottom main zone 207*a*), 440 millimeters (top main zone 205*b*), and 220 millimeters (top tail zone 205*a*). The heater zones and the bottom of the autoclave are surrounded by firebrick or other suitable insulating material (upper heater 205, lower heater 207, thermal insulation 232) to minimize the electrical load on the heating elements. The outside of the brick insulating walls are subject to convective boundary conditions from the ambient air. The inner volume of the growth chamber, as modeled, is shown in FIG. 10A. A bed of polycrystalline nutrient 113 is disposed within the nutrient zone in the top half of the growth chamber. Baffle 109 is placed 60.8 millimeters from the bottom of the poly-GaN bed. Bottom baffle 213 is placed in the growth chamber 559.9 millimeters from baffle 109 and near the bottom surface 215 of the inner volume. Seventy-seven GaN seed crystals 111 are divided into seven tiers of eleven seeds and, with an even vertical spacing, are dispersed between baffle 109 and bottom baffle 213, as shown in FIG. 10B. The horizontal spacing between the seeds is maintained at 12.7 millimeters. The volume of the inner growth volume below the middle baffle is referred to as the growth zone. All of the above features were modeled using the ANSYS suite of software, including ANSYS SPACECLAIM™ and ANSYS FLUENT™. A steady-state, conjugate heat transfer analysis, i.e., a coupled analysis combining computational fluid dynamics of the inner volume along with the analysis of heat transfer in the entire system, was carried out to study the effect of using the bottom heating zone. Two different cases were considered, 1) Case 1: No wattage flux was introduced at the bottom zone and wattage flux was applied along the sidewalls of the autoclave into the four zones.
2) Case 2: A radially-varying wattage flux was introduced at the bottom end heater 231 and wattage flux was applied along the sidewalls of the autoclave into the four zones.

Figure 10C:
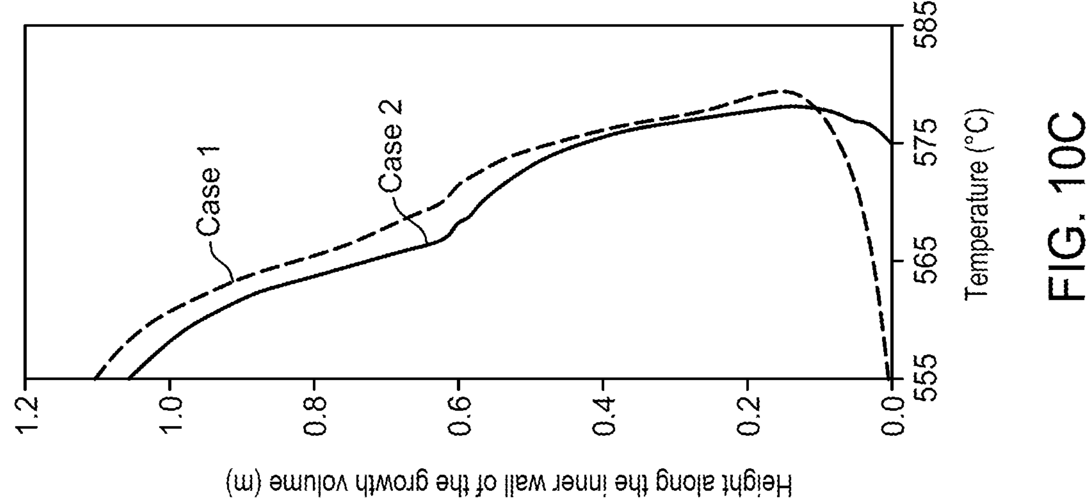
FIG. 10C is a schematic diagram showing temperature distributions calculated using commercially available thermal modelling software, according to a specific embodiment of the current disclosure.

In both cases the wattage flux in each zone was adjusted until the volume-averaged temperatures in the nutrient and growth zones was close to 562° C. and 571° C. respectively. These temperatures were chosen to be within the range when ammonothermal growth of single crystal GaN is known to occur. In actual practice temperatures ranging from 400° C. to 850° C. may be chosen, depending on crystal growth objectives. The results of the study are summarized in Table 1 below, and the dimensions of the end zones of bottom end heater 231 are shown in FIG. 10B. The calculated temperature distributions along the lower portion of inner surface 825 in the two cases is shown in FIG. 10C.

| | | Power (W) | |
|---|---|---|---|
| | | Case 1 | Case 2 |
| Side wall heat flux (W/m^2) | Bottom tail zone | 9000.0 | 7093.2 |
| | Bottom main zone | 6363.3 | 6363.3 |
| | Top main zone | 6137.8 | 6137.8 |
| | Top tail zone | 6448.8 | 6448.8 |
| Bottom wall heat flux (W/m^2) | End zone 1 | 0.0 | 5254.0 |
| | End zone 2 | 0.0 | 5784.4 |
| | End zone 3 | 0.0 | 7032.0 |
| | End zone 4 | 0.0 | 9430.9 |

-continued

| | Power (W) | |
|---|---|---|
| | Case 1 | Case 2 |
| End zone 5 | 0.0 | 17277.0 |
| Growth zone temperature (volume averaged, ° C.) | 570.7 | 570.8 |
| Nutrient zone temperature (volume averaged, ° C.) | 563.1 | 559.8 |
| Temperature range at the bottom of growth zone (° C.) | 10.0 | 1.0 |
| Temperature range on bottom baffle (° C.) | 1.0 | 0.2 |

In case 1, where no bottom heater is present, significant additional power needed to be added to the bottom tail zone in order to maintain the volume-averaged temperature in the growth zone at the target value.

In case 2, the power distribution in the 5-zone, bottom end heater was chosen to provide a relatively uniform temperature along the outer bottom surface of the autoclave, which is much easier to measure experimentally than the temperature distribution along bottom surface 215.

In case 1, the temperatures along bottom surface 215 and bottom baffle 213 varied by 10° C. and 1° C., respectively, and the temperature along the bottom 0.2 m of inner surface 825 varied by approximately 26° C. (FIG. 10C). The sharpness of the minimum at the bottom of inner surface 825 can be reduced by increasing the wattage of the bottom tail zone, but at the cost of increasing the magnitude of the local temperature maximum at a height of 0.17 m and increasing the temperature range along bottom surface 215.

In case 2, the temperatures along bottom surface 215 and bottom baffle 213 varied by 1° C. and 0.2° C., respectively, and the temperature along the bottom 0.2 m of inner surface 825 varied by approximately 6° C. (FIG. 10C), a marked improvement.

Example 2

An internally-heated high-pressure apparatus, similar to that shown schematically in FIG. 3, was provided. Materials of construction for the internally-heated high-pressure apparatus include 17-4 stainless steel, zirconia, and Inconel 718. A capsule, including an inner capsule 307 a fabricated from silver and an outer capsule 307*b* fabricated from 304 stainless steel, was provided for ammonothermal crystal growth of GaN and was slidingly inserted into a cylindrical heater 305, as shown schematically in FIGS. 3 and 8. The inner capsule had an inner diameter of 142 millimeters, an outer diameter of 145 millimeters, and was 749 millimeters high. The cylindrical heater had five independently-controllable hot zones. A finite-element model for the internally-heated high-pressure apparatus was entered into ANSYS FLUENT™. The model was then validated by measuring the values of approximately 74 thermocouples, including approximately 64 thermocouples embedded in heater 305 and 10 additional thermocouples in contact with topmost and bottommost high strength enclosure rings 301 near their contact with ceramic rings 303, the top and bottom surfaces of upper and lower crown members 317 near the central axis, and air gaps within and immediately above and below the structure, and comparing measured temperatures to those calculated by inputting wattages into the heater equal to experimental values.

We found, using CFD, that if the radial power density of the end heater was approximately uniform over the diameter of the capsule, there was a pronounced temperature maximum near the bottom center of the capsule. Further analysis indicated that this effect was due to thermal conduction from the bottom of lower heater 305*b* to crown member 317. However, this effect could be eliminated by use of a spiral-design bottom end heater, similar to that shown schematically in FIG. 7A, that produced approximately zero power for radius values less than about 37 millimeters and a constant power density for radius values between about 37 millimeters and about 71 millimeters. Similar results could be obtained with a serpentine heater similar to that shown schematically in FIG. 7C or with a labyrinthine bottom end heater similar to that shown schematically in FIG. 7D.

A CFD case was calculated with 0.6 kW applied to the topmost (tail) hot zone of heater 305*a*, 4.3 kW applied to the main zone of heater 305*a*, 3.4 kW applied to an upper zone of lower heater 305*b*, 4.6 kW applied to a lower zone of lower heater 305*b*, and 0.3 kW applied to the bottommost (tail) zone of lower heater 305*b*. Based on the CFD results, with 0.7 kW applied to bottom end heater 331, the temperature along the bottom surface 215 of inner capsule 307 a was constant to within about 1 degree Celsius, and the temperature along the bottom surface 215 and the lowermost 100 millimeters of the inner surface 825 of inner capsule 307*a* was uniform to within approximately 4 degrees Celsius. Similarly, with 0.6 kW applied to an identically-dimensioned end heater at the top end of capsule 307, the temperature along the top surface and the uppermost 100 millimeters of inner capsule 307*a* was uniform within approximately 1 degree Celsius. In the absence of the end heaters the corresponding temperature variations along the bottom end and near-bottom region of the capsule and the top end and near-top region of the capsule were approximately 12 degrees Celsius and approximately 4 degrees Celsius, respectively.

An additional analysis was performed with a bottom baffle 213, having four 12-millimeter holes and an annular radial gap of approximately 5 millimeters and placed approximately 75 millimeters above the bottom surface 215 of inner capsule 307*a*. For end heater powers between about 0.07 kW and about 0.37 kW the temperature was found to be uniform to within about 1 degree Celsius along bottom baffle 213.

Example 3

An internally-heated high-pressure apparatus, similar to that shown schematically in FIG. 3, was provided. Materials of construction for the internally-heated high-pressure apparatus include 17-4 stainless steel, zirconia, and Inconel 718. A capsule, including an inner capsule fabricated from silver and an outer capsule fabricated from 304 stainless steel, was provided for ammonothermal crystal growth of GaN and was slidingly inserted into a cylindrical heater, as shown schematically in FIG. 3. The inner capsule had an inner diameter of 228 millimeters, an outer diameter of 234 millimeters, and was 1257 millimeters high. The cylindrical heater had four independently-controllable hot zones. A finite-element model for the internally-heated high-pressure apparatus was entered into ANSYS FLUENT™. The model was then validated by measuring the values of approximately 106 thermocouples, including approximately 96 thermocouples embedded in heater 305 and 10 additional thermocouples in contact with topmost and bottommost high strength enclosure rings 301 near their contact with ceramic rings 303, the top and bottom surfaces of upper and lower crown members 317 near the central axis, and air gaps within and immediately above and below the structure, and comparing measured temperatures to those calculated by inputting wattages into the heater equal to experimental values.

A CFD case was calculated for a bottom end heater configuration that produced approximately zero power for radius values less than about 70.5 millimeters and a constant power density for radius values between about 70.5 millimeters and about 121 millimeters. A bottom baffle, with 12 12-mm holes and a radial annular gap of approximately 5 millimeters and located approximately 75 mm above the bottom surface 215 of inner capsule 307*a*, was present. With 0.922 kW applied to the topmost (tail) hot zone of heater 305*a*, 16.989 kW applied to the main zone of upper heater 305*a*, 18.0 kW applied to the main zone of lower heater 305*b*, 1.08 kW applied to the bottommost (tail) zone of lower heater 305*b*, and with 0.30 kW applied to bottom end heater 331, the temperature along the bottom surface 215 of inner capsule 307*a* was constant to within about 1 degree Celsius, the temperature along bottom baffle 213 was constant to within about 1 degree Celsius, and the temperature along the bottom surface 215 and the lowermost 200 millimeters of the inner surface 825 of inner capsule 307*a* was uniform to within approximately 11 degrees Celsius. In the absence of the end heater the corresponding temperature variations along the bottom end, bottom baffle, and near-bottom region of the capsule were approximately 4 degrees Celsius, approximately 2 degrees Celsius, and approximately 17 degrees Celsius, respectively.

Another CFD case was calculated for a bottom end heater configuration that produced approximately zero power for radius values less than about 6 millimeters and a constant power density for radius values between about 6 millimeters and about 121 millimeters. No bottom baffle was present within inner capsule 307*a* in this case. With 0.975 kW applied to the topmost (tail) hot zone of heater 305*a*, 17.238 kW applied to the main zone of upper heater 305*a*, 18.08 kW applied to the main zone of lower heater 305*b*, 0.70 kW applied to the bottommost (tail) zone of lower heater 305*b*, and with 0.50 kW applied to bottom end heater 331, the temperature along the bottom surface 215 of inner capsule 307*a* was constant to within about 2 degrees Celsius and the temperature along the bottom surface 215 and the lowermost 200 millimeters of the inner surface 825 of inner capsule 307*a* was uniform to within approximately 8 degrees Celsius. Alternatively, with 0.975 kW applied to the topmost (tail) hot zone of heater 305*a*, 17.238 kW applied to the main zone of upper heater 305*a*, 18.03 kW applied to the main zone of lower heater 305*b*, 0.20 kW applied to the bottommost (tail) zone of lower heater 305*b*, and with 1.00 kW applied to bottom end heater 331, the temperature along the bottom surface 215 of inner capsule 307*a* was constant to within about 7 degrees Celsius and the temperature along the bottom surface 215 and the lowermost 200 millimeters of the inner surface 825 of inner capsule 307*a* was uniform to within approximately 3 degrees Celsius.

While the foregoing is directed to embodiments of the present disclosure, other and further embodiments of the disclosure may be devised without departing from the basic scope thereof, and the scope thereof is determined by the claims that follow.

What is claimed is:

1. An apparatus for solvothermal crystal growth, the apparatus comprising:

a pressure vessel having a cylindrical shaped portion having a vertical orientation and extending between a top end and a bottom end, wherein the pressure vessel is configured to process a material in a fluid at a pressure above about 5 megapascal and less than about 2000 megapascal and temperatures above about 200 degrees Celsius and less than about 1500 degrees Celsius;

a cylindrical heater having an upper zone and a lower zone that are each disposed around the cylindrical shaped portion;

a growth chamber having a bottom end surface, a cylindrical shape, and positioned within the cylindrical shaped portion of the pressure vessel;

a bottom insulating member below the bottom end surface; and at least one bottom end heater, positioned between the bottom end surface and the bottom insulating member, wherein the bottom end heater includes a center, an outer radius that extends from the center, an inner region with an inner radius that extends from the center, an outer region between the inner radius and an outer radius, a ratio of the inner radius to the outer radius is at least about 3%, and is configured to provide a varying power density within the bottom end heater whereby a power density within the inner region that is at least 25% less than a power density in the outer region, wherein the varying power density within the bottom end heater is provided by at least one of a heating element having a larger cross section, in a direction perpendicular to electrical current flow, within the inner region than within the outer region, a heating element wherein a spacing between adjacent segments is larger within the inner region than within the outer region, or at least two independently-controllable hot zones.

2. The apparatus of claim 1, wherein the bottom end surface of the growth chamber includes a bottom radial distance, the growth chamber includes an inner diameter with a bottom axial distance that intersects with the bottom end surface, and the bottom end heater is configured to enable:

a variation in a temperature along the bottom radial distance of the bottom end surface to be less than about 10 degrees Celsius, during a crystal growth process; and a variation in a temperature along the bottom axial distance of at least 100 millimeters along the inner diameter of the growth chamber to be less than about 20 degrees Celsius, during the crystal growth process.

3. The apparatus of claim 2, wherein the at least one bottom end heater and the cylindrical heater are further configured to provide a temperature variation along the bottom axial distance of about 10 degrees Celsius or less, during a crystal growth process.

4. The apparatus of claim 3, wherein the at least one end bottom heater and the cylindrical heater are further configured to provide a temperature variation along the bottom axial distance of about 5 degrees Celsius or less, during a crystal growth process.

5. The apparatus of claim 2, wherein the bottom axial distance comprises a cylindrical portion of the inner diameter of the growth chamber within an axial distance of at least 200 millimeters of the bottom end surface.

6. The apparatus of claim 2, wherein the variation in the temperature along the bottom radial distance is less than about 5 degrees Celsius.

7. The apparatus of claim 1, wherein the pressure vessel comprises an autoclave.

8. The apparatus of claim 1, wherein the pressure vessel is internally heated.

9. The apparatus of claim 1, wherein the at least one end heater provides a power density that is azimuthally uniform to within 20%.

10. The apparatus of claim 1, wherein a power density in the lower zone of the cylindrical heater has a power density variation that is less than about 20% within 100 mm of the bottom end surface of the growth chamber.

11. The apparatus of claim 1, further including a third radius that is positioned between the inner radius and the outer radius and the outer region has a power density that increases, as a function of radius, between the inner radius and the third radius.

12. The apparatus of claim 1, wherein the end heater comprises a heating element member having a configuration chosen from one or more of a spiral, a double spiral, a serpentine, or a labyrinthine structure.

13. The apparatus of claim 1, wherein the end heater comprises a jacket that is configured to support at least one heating element within the at least one end heater, the jacket comprising one or more of stainless steel, Inconel 718, Inconel 600, iron, nickel, molybdenum, titanium, and tantalum, and alloys thereof.

14. The apparatus of claim 1, wherein the end heater comprises at least two independently-controllable hot zones.

15. The apparatus of claim 1, wherein the growth chamber includes a top end surface with a top radial distance, an inner diameter with a top axial distance that intersects with the top end surface, and the apparatus further comprising a top insulating member, one of a top end heater or a top combination insulator and heater, wherein the top end heater or combination insulator and heater is positioned between the top end surface of the growth chamber and the top insulating member and configured to enable:

a variation in a temperature along the top radial distance of the top end surface to be less than about 10 degrees Celsius, during a crystal growth process; and a variation in a temperature along the top axial distance of at least 100 millimeters from the top end of surface to be less than about 20 degrees Celsius, during a crystal growth process.

16. The apparatus of claim 15, wherein a variation in temperature along the top radial distance is less than about 5 degrees Celsius.

17. The apparatus of claim 15, wherein the top end heater or the top combination insulator and heater and the cylindrical heater are further configured to enable a temperature distribution along the top axial distance to be constant, to within about 10 degrees Celsius, during the crystal growth process.

18. The apparatus of claim 15, wherein the pressure vessel comprises an autoclave and the top combination insulator and heater includes capability to generate heat.

* * * * *